(12) United States Patent
Pyo et al.

(10) Patent No.: US 11,805,610 B2
(45) Date of Patent: Oct. 31, 2023

(54) DISPLAY DEVICE

(71) Applicant: LG ELECTRONICS INC., Seoul (KR)

(72) Inventors: Jonggil Pyo, Seoul (KR); Chulki Kim, Seoul (KR); Seunggyu Kang, Seoul (KR); Jaehun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/834,030

(22) Filed: Jun. 7, 2022

(65) Prior Publication Data

US 2023/0262908 A1    Aug. 17, 2023

(30) Foreign Application Priority Data

Feb. 15, 2022 (KR) .......................... 10-2022-0019786

(51) Int. Cl.
 *H05K 5/02* (2006.01)
 *H05K 5/04* (2006.01)
(52) U.S. Cl.
 CPC ............. *H05K 5/0217* (2013.01); *H05K 5/04* (2013.01)
(58) Field of Classification Search
 CPC ...... H05K 5/04; H05K 5/0217; G06F 1/1652; G02F 1/133305
 See application file for complete search history.

(56) References Cited

U.S. PATENT DOCUMENTS

| | | | | |
|---|---|---|---|---|
| 9,510,440 B2* | 11/2016 | Nam | ...................... | G06F 1/1652 |
| 11,416,034 B2* | 8/2022 | Yoo | ....................... | G06F 1/1652 |
| 11,567,546 B2* | 1/2023 | Kim | ........................ | G06F 1/181 |
| 11,659,672 B2* | 5/2023 | Cho | ..................... | H05K 5/0226 |
| | | | | 361/807 |
| 2014/0354519 A1* | 12/2014 | Lee | ........................ | G09F 9/301 |
| | | | | 345/76 |

(Continued)

FOREIGN PATENT DOCUMENTS

| JP | 2013-93720 A | 5/2013 |
|---|---|---|
| KR | 10-2014-0141400 A | 12/2014 |

(Continued)

*Primary Examiner* — Sagar Shrestha
(74) *Attorney, Agent, or Firm* — Birch, Stewart, Kolasch & Birch, LLP

(57) ABSTRACT

A display device includes a main body including a display module for outputting an image and bendable, a bending module located at a center of a back surface of the main body, a pair of links, wherein each link has one end coupled to the bending module and extends in a horizontal direction, and link brackets respectively located at left and right ends of the main body, wherein the other end of each link is connected to each link bracket. The bending module changes angles of the pair of links, and, when the angle of the link changes, the other end of the link slides in the horizontal direction with respect to the link bracket. The main body includes an inner sheet disposed on a back surface of the display module, a cover bottom disposed on a back surface of the inner sheet, and a middle cabinet for covering perimeters of the display module, the inner sheet, and the cover bottom and forming a side surface appearance of the display device. The link bracket is disposed overlapping the middle cabinet.

13 Claims, 16 Drawing Sheets

(56) References Cited

U.S. PATENT DOCUMENTS

| | | | | |
|---|---|---|---|---|
| 2015/0223358 A1* | 8/2015 | Nam | ................. | G06F 1/1652 |
| | | | | 74/102 |
| 2015/0296641 A1* | 10/2015 | Song | ................. | H05K 5/0217 |
| | | | | 361/679.01 |
| 2016/0127674 A1* | 5/2016 | Kim | ................. | H04N 21/42204 |
| | | | | 348/739 |
| 2016/0353594 A1* | 12/2016 | Cho | ................. | F16M 11/08 |
| 2017/0188470 A1* | 6/2017 | Cho | ................. | G09F 9/301 |
| 2020/0409418 A1* | 12/2020 | Yoo | ................. | G06F 1/1675 |
| 2022/0201883 A1* | 6/2022 | Cho | ................. | G09F 9/301 |
| 2022/0346247 A1* | 10/2022 | Won | ................. | H05K 5/0017 |

FOREIGN PATENT DOCUMENTS

| | | |
|---|---|---|
| KR | 10-2016-0050689 A | 5/2016 |
| KR | 10-2016-0141009 A | 12/2016 |
| KR | 10-2301373 B1 | 9/2021 |

\* cited by examiner

FIG. 2
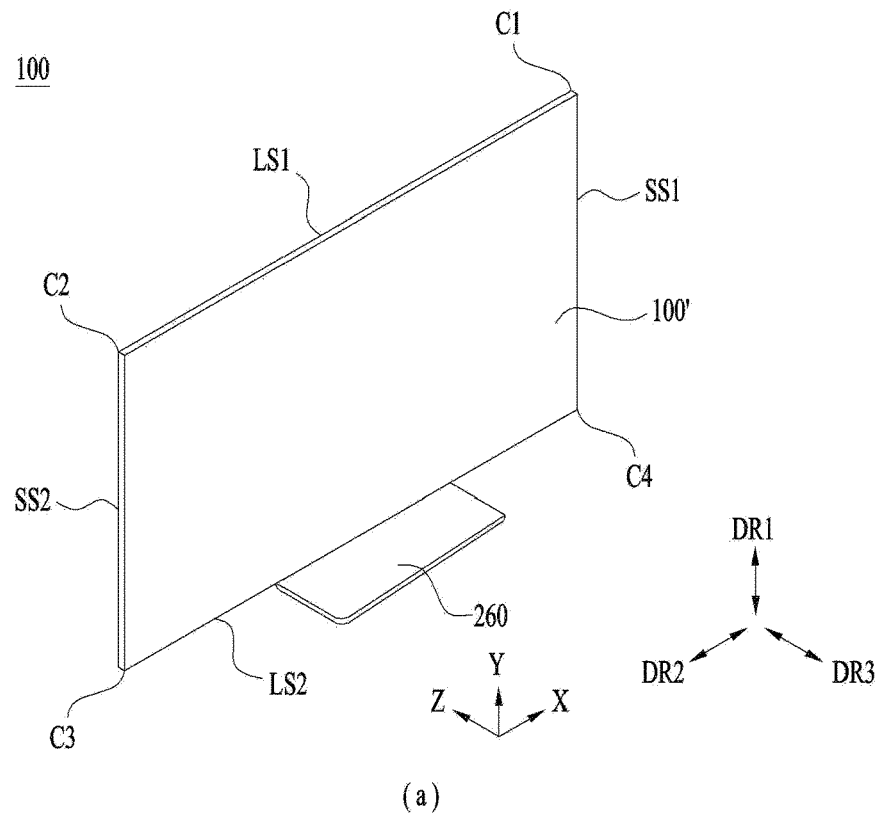
(a)
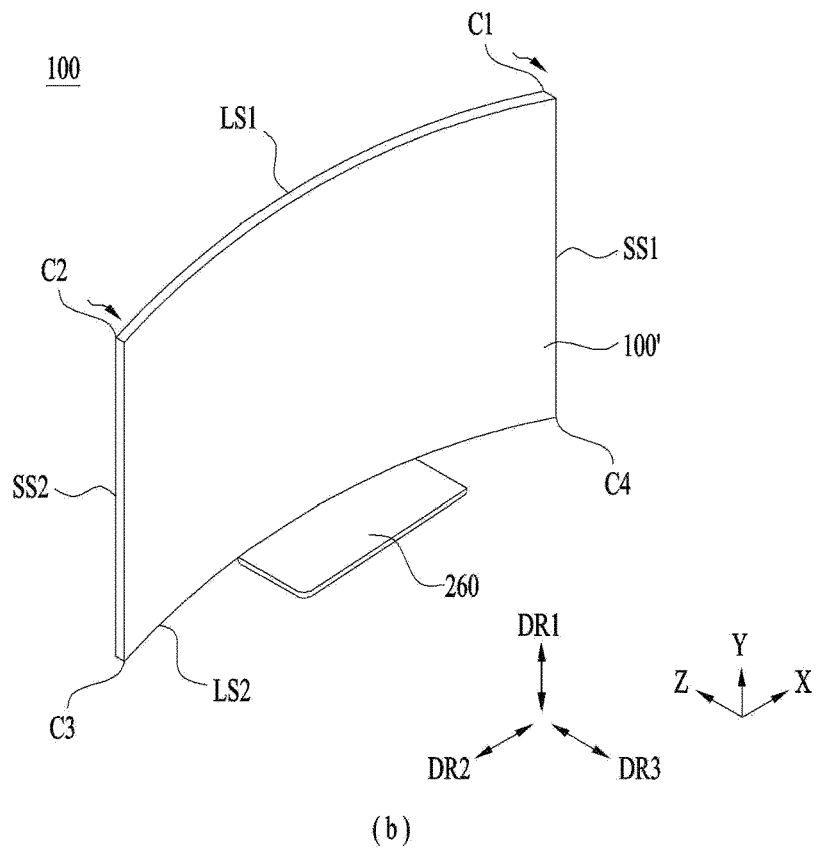
(b)

FIG. 6
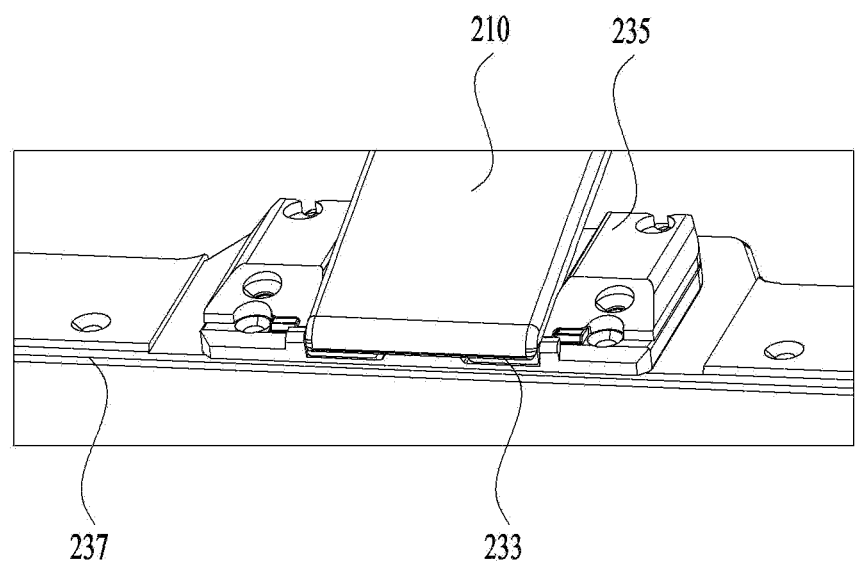
(a)
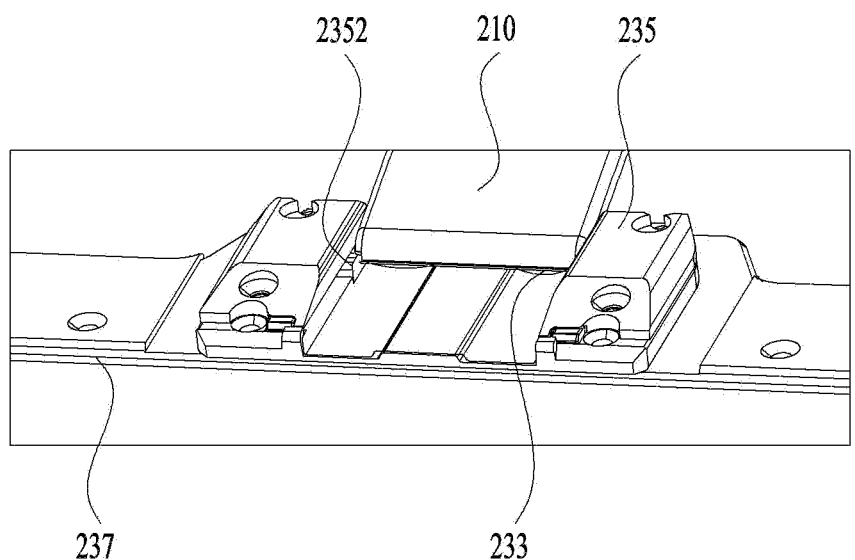
(b)

FIG. 7
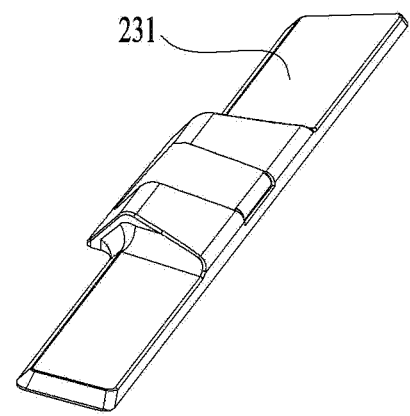
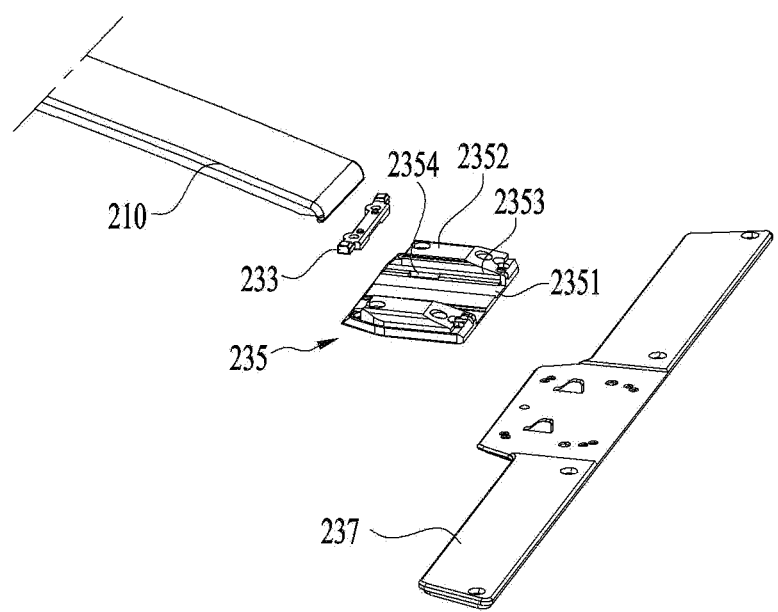

(a)

(b)

FIG. 10
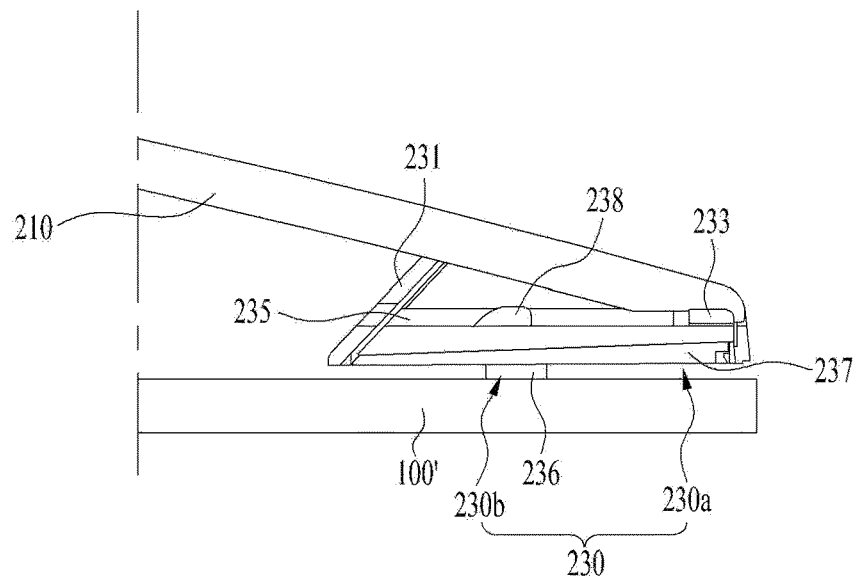
(a)
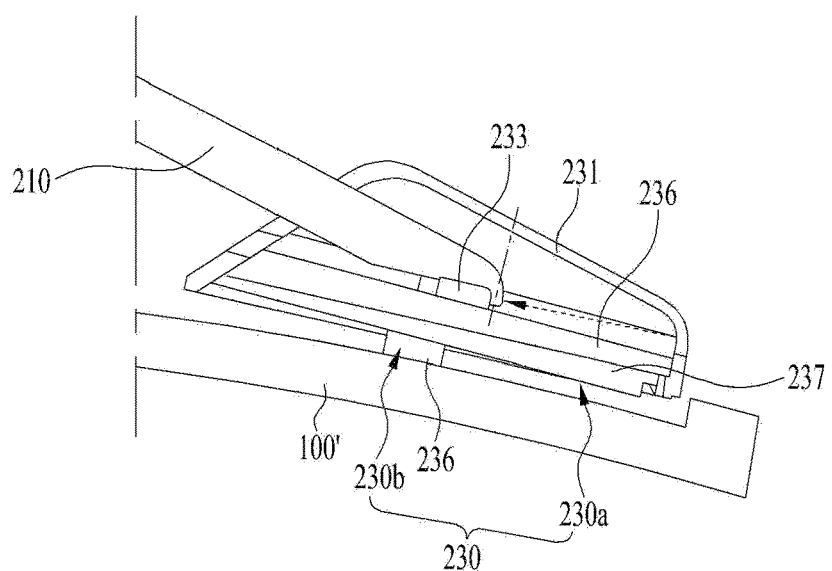
(b)

FIG. 11
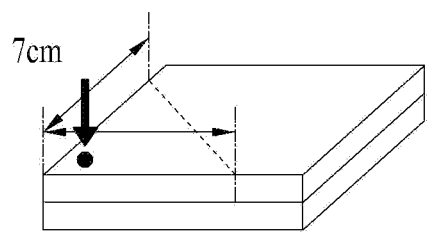
(a)
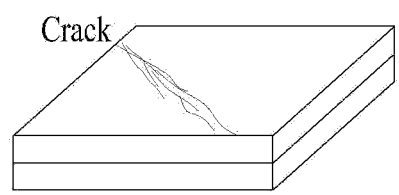
(b)

(a)  (b)

DISPLAY DEVICE

This application claims the benefit of Korean Patent Application No. 10-2022-0019786, filed on Feb. 15, 2022, which is hereby incorporated by reference as if fully set forth herein.

BACKGROUND

Field

The present disclosure relates to a display device having a curved surface structure capable of improving the degree of immersion of a user who views the display device.

Discussion of the Related Art

With the increasing development of information society, the demand for display devices is also increasing in various forms. In response to this trend, various display devices, for example, Liquid Crystal Display (LCD), Field Emission Display (FED), Plasma Display Panel (PDP), an electroluminescent device, etc. have recently been developed.

A liquid crystal panel of the LCD may include a liquid crystal layer, may further include a thin film transistor (TFT) substrate and a color filter substrate that are arranged to face each other on the basis of the liquid crystal panel interposed therebetween, and may display an image using light provided from a backlight unit.

As an example of an electroluminescent device, active-matrix-type organic light emitting display (OLED) devices are commercially available on the market and widely used throughout the world. Since the OLED device is a self-emitting device, the OLED device has no backlight and is advantageous in terms of a response speed and a viewing angle as compared to the LCD, so that the OLED devices are attracting attention as next-generation displays.

As described above, since the OLED device has no backlight, the OLED device can be bent and deformed in shape, resulting in implementation of a curved display module. The curved display module can increase the sense of immersion of a user. However, when a plurality of users simultaneously views the curved display module, the plurality of users may feel inconvenience in viewing images displayed on the curved display as compared to a flat panel display. There is also a problem in that the OLED device occupies a space when not in use.

SUMMARY

The present disclosure is to provide a display device capable of preventing a display module from being damaged and changing a curvature in order to solve the above problem.

In an aspect of the present disclosure, provided is a display device including a main body including a display module for outputting an image and bendable, a bending module located at a center of a back surface of the main body, a pair of links, wherein each link has one end coupled to the bending module and extends in a horizontal direction, and link brackets respectively located at left and right ends of the main body, wherein the other end of each link is connected to each link bracket, wherein the bending module changes angles of the pair of links, wherein, when the angle of the link changes, the other end of the link slides in the horizontal direction with respect to the link bracket, wherein the main body includes an inner sheet disposed on a back surface of the display module, a cover bottom disposed on a back surface of the inner sheet, and a middle cabinet for covering perimeters of the display module, the inner sheet, and the cover bottom and forming a side surface appearance of the display device, wherein the link bracket is disposed overlapping the middle cabinet.

In one implementation, the middle cabinet may include each vertical middle cabinet located on each side of the main body, and the vertical middle cabinet may include an exposed portion for forming the side surface appearance of the display device, and a rigid portion extending from an inner surface of the exposed portion, wherein the display module is located in front of the rigid portion and the link bracket is coupled to a back surface of the rigid portion.

In one implementation, the display device may further include a bracket fastener for connecting the link bracket and the main body to each other, and the bracket fastener may be fastened to the rigid portion.

In one implementation, the middle cabinet may further include a rib located between the inner sheet and the cover bottom, and the cover bottom may slide on the rib when the main body is bent.

In one implementation, the link bracket may cover an interface between the cover bottom and the vertical middle cabinet.

In one implementation, the middle cabinet may include each horizontal middle cabinet positioned at each of top and bottom of the main body and extending in the horizontal direction, the horizontal middle cabinet may further include an exposed portion for forming a side surface appearance of the main body, and a back protrusion located on the back surface of the main body, and the link bracket may extend to the top or the bottom of the main body to overlap the back protrusion.

In one implementation, the horizontal middle cabinet may further include a first hook formed on the rib, and the display device may include a second hook located at an end of the inner sheet and fastened to the first hook.

In one implementation, the middle cabinet may contain aluminum.

In one implementation, when the main body is bent, the other end of the link may slide from a first portion of the link bracket to a second portion, and the display device may further include a bracket fastener for connecting the second portion of the link bracket to the main body.

In one implementation, the link bracket may include a link side block in contact with the other end of the link, and the link side block may include a side wall for limiting a vertical position of the other end of the link, and a stopper for limiting a horizontal movement range of the other end of the link.

The display device of the present disclosure may transform the display module into the flat state or the bent state, so that the display device may be used by the user in the desired shape.

As described above, the display device of the present disclosure may increase the crack load of the corner of the main body, so that the durability of the display device may be improved.

In addition, despite the slip of the cover bottom that occurs during the bending of the display device, the end of the cover bottom may be covered so as not to be exposed to the outside, so that the exterior design may be improved and the defects such as the deformation may be prevented.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 is a perspective view illustrating an example of a display device according to an embodiment of the present disclosure.

FIG. 6 is a view illustrating a fastened state of a link and a link bracket of a display device.

FIG. 7 is an exploded perspective view of a link and a link bracket of a display module.

FIG. 10 is a view illustrating another embodiment of a link and a link bracket in a flat state and a curved state of a display device.

FIG. 11 is a diagram illustrating a method for measuring rigidity of a display module.

DESCRIPTION OF SPECIFIC EMBODIMENTS

Figure 1:
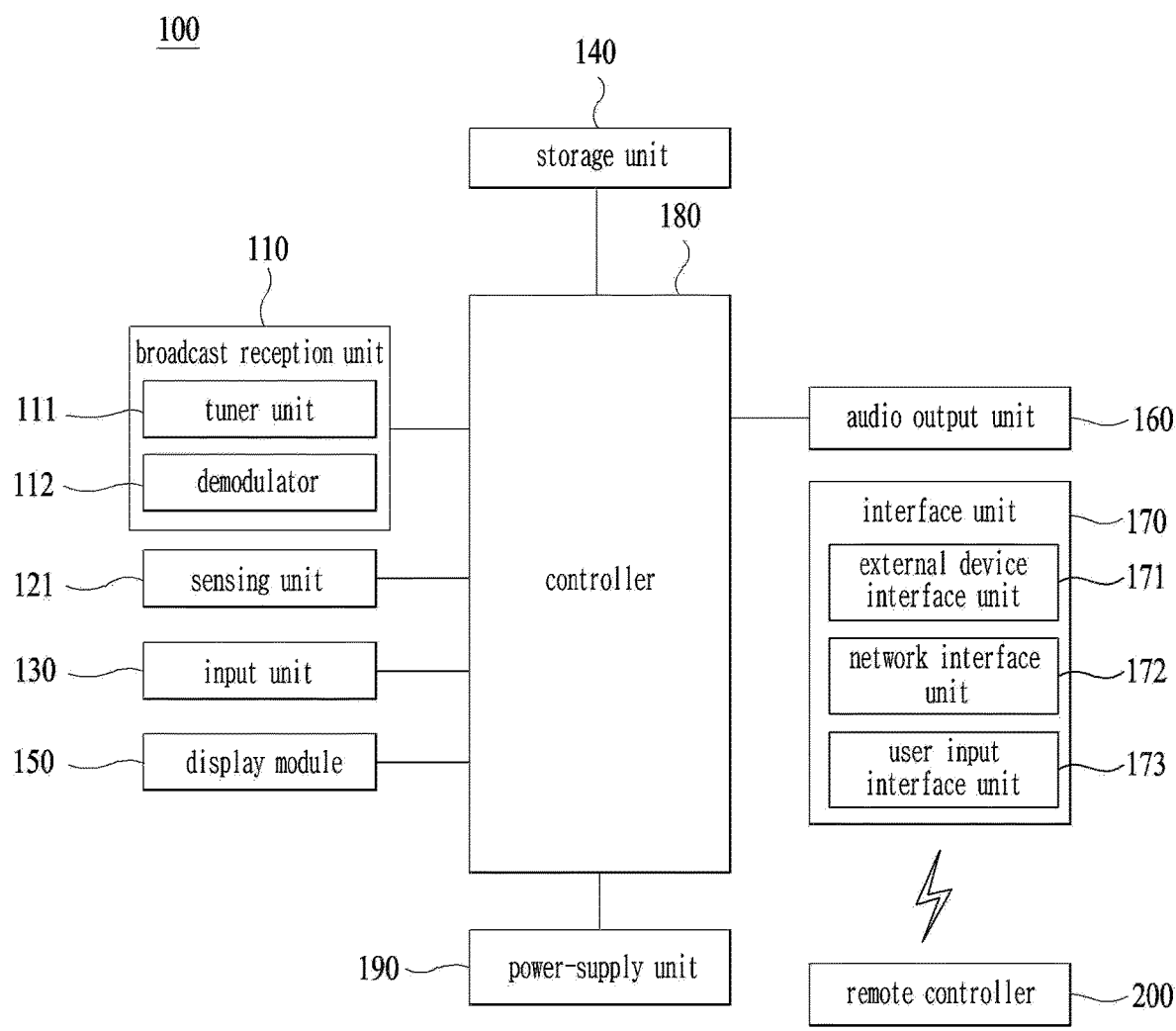
FIG. 1 is a block diagram illustrating constituent elements of a display device according to an embodiment of the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

On the other hand, the image display device described herein is, for example, an intelligent image display device implemented by adding a computer support function to a broadcast reception function, and further includes an Internet function or the like while sufficiently performing the broadcast reception function, so that the image display device may have user-friendly interfaces such as a handwriting input device, a touchscreen, or a spatial remote controller. Further, the image display device can support a wired or wireless Internet function by connecting to the Internet and a computer device, thereby performing e-mailing, web browsing, banking, or gaming. To implement these functions, the image display device may operate based on a standard general-purpose Operating System (OS).

Accordingly, the image display device according to the present disclosure is designed in a manner that various applications can be easily added to or deleted from a general-purpose OS kernel so that the image display device can perform various user-friendly functions. The image display device may be, for example, a network TV, a Hybrid broadcast broadband TV (HBBTV), a smart TV, etc. The image display device is applicable to a smartphone as needed.

FIG. 1 is a block diagram illustrating constituent elements of a display device 100 according to an embodiment of the present disclosure. Referring to FIG. 1, the display device 100 may include a broadcast reception unit 110, an external device interface unit 171, a network interface unit 172, a storage unit 140, a user input interface unit 173, an input unit 130, a controller 180, a display 150, an audio output unit 160, and/or a power-supply unit 190.

The broadcast reception unit 110 may include a tuner unit 111 and a demodulator 112.

Although not shown in the drawings, the display device 100 may include only the external device interface unit 171 and the network interface unit 172 from among the broadcast reception unit 110, the external device interface unit 171, and the network interface unit 172. That is, the display device 100 may not include the broadcast reception unit 110.

The tuner unit 111 may select a broadcast signal corresponding to either a user-selected channel or all prestored channels from among broadcast signals received through an antenna (not shown) or a cable (not shown). The tuner unit 111 may convert the selected broadcast signal into an intermediate frequency (IF) signal or a baseband image or a voice signal.

For example, when the selected broadcast signal is a digital broadcast signal, the tuner unit 111 may convert the selected broadcast signal into a digital IF (DIF) signal. When the selected broadcast signal is an analog broadcast signal, the tuner unit 111 may convert the selected broadcast signal into an analog baseband image or a voice signal (CVBS/SIF). That is, the tuner unit 111 may process the digital broadcast signal or the analog broadcast signal. The analog baseband image or the voice signal (CVBS/SIF) output from the tuner unit 111 may be directly input to the controller 180.

The tuner unit 111 may sequentially select broadcasting signals of all broadcasting channels stored through a channel memory function from among the received broadcast signals, and may convert the selected broadcast signal into an intermediate frequency (IF) signal or a baseband image or a voice signal.

The tuner unit 111 may include a plurality of tuners to receive broadcast signals of the plurality of channels. Alternatively, a single tuner for simultaneously receiving broadcast signals of the plurality of channels is also possible.

The demodulator 112 may receive the digital IF signal (DIF) converted by the tuner unit 111, and may thus perform demodulation of the received signal. The demodulator 112 may perform demodulation and channel decoding, and may output a stream signal (TS). The stream signal may be a signal formed by multiplexing an image signal, a voice signal, or a data signal.

The stream signal (TS) output from the demodulator 112 may be input to the controller 180. The controller 180 may perform demultiplexing, image/audio signal processing, etc., may output an image through the display 150, and may output a voice through the audio output unit 160.

The sensing unit 120 may sense a change in the display device 100 or may sense an external change. For example, the sensing unit 120 may include a proximity sensor, an illumination sensor, a touch sensor, an infrared (IR) sensor, an ultrasonic sensor, an optical sensor (e.g., a camera), a voice sensor (e.g., a microphone), a battery gauge, environmental sensors (e.g., hygrometer, a thermometer, etc.).

The controller 180 may check a state of the display device 100 based on information collected by the sensing unit 120, may notify the user of a problem, or may control the display device 100 to be kept in the best state.

In addition, it is possible to provide an optimal viewing environment by differently controlling the content, image quality, size, etc. of the image provided to the display module 180 depending on the viewer, ambient illuminance, etc. sensed by the sensing unit. As the smart TV has evolved, the number of functions mounted in the display device increases, and the number of the sensing units 20 also increases together with the increasing functions.

The input unit 130 may be provided at one side of a main body of the display device 100. For example, the input unit 130 may include a touch pad, a physical button, and the like. The input unit 130 may receive various user commands related to the operation of the display device 100, and may transmit a control signal corresponding to the input command to the controller 180.

Recently, as a bezel of the display device 100 decreases in size, the number of display devices 100 each including a minimum number of input unit 130 formed in a physical button exposed to the outside is rapidly increasing. Instead, a minimum number of physical buttons may be provided on the back or side surface of the display device 100. The display device may receive a user input through the remote controller 200 through a touchpad or a user input interface unit 173 to be described later.

The storage unit 140 may store a program for processing and controlling each signal used in the controller 180, and may store a signal-processed image, a voice, or a data signal. For example, the storage unit 140 may store application programs designed for the purpose of performing various tasks that can be processed by the controller 180, and may selectively provide some of the stored application programs upon request of the controller 180.

The program stored in the storage unit 140 is not specifically limited to being executed by the controller 180. The storage unit 140 may perform a function for temporarily storing an image, a voice, or a data signal received from an external device through the external device interface unit 171. The storage unit 140 may store information about a predetermined broadcast channel through a channel memory function such as a channel map.

Although the storage unit 140 of FIG. 1 is provided separately from the controller 180, the scope of the present disclosure is not limited thereto, and the storage unit 140 may also be included in the controller 180 as needed.

The storage unit 140 may include at least one of a volatile memory (e.g., DRAM, SRAM, SDRAM, etc.) and a non-volatile memory (e.g., flash memory, hard disk drive (HDD), solid state drive (SSD), etc.).

The display 150 may generate a drive signal by converting an image signal, a data signal, an OSD signal, a control signal processed by the controller 180, or by converting an image signal, a data signal, a control signal, etc. received from the interface unit 171. The display 150 may include a display panel 181 having a plurality of pixels.

A plurality of pixels included in the display panel may include RGB sub-pixels. Alternatively, a plurality of pixels included in the display panel may include sub-pixels of RGBW. The display 150 may convert the image signal, the data signal, the OSD signal, the control signal, etc. processed by the controller 180 to generate a drive signal for the plurality of pixels.

The display 150 may be implemented as a plasma display panel (PDP), a liquid crystal display (LCD), an organic light emitting diode (OLED), a flexible display, etc. In addition, the display 150 may also be implemented as a three-dimensional (3D) display. The three-dimensional (3D) display 150 may be classified into a glassless-type 3D display and a glasses-type 3D display.

The display device may include a display module that occupies most parts of the front surface, and a case that covers the back and side surfaces of the display module and packages the display module.

Recently, the display device 100 has evolved from a flat-screen display to a curved-screen display. In order to implement the curved screen, the display device 100 may use a display module 150 that can be bent or curved, such as a light emitting diode (LED) or an organic light emitting diode (OLED), etc.

Conventionally, the LCD has difficulty in self-emitting light, so that the conventional LCD has been designed to receive light through a backlight unit. The backlight unit is a device for uniformly supplying light received from a light source to a liquid crystal located on the front surface of the display device. As the backlight becomes thinner, a thin LCD can be implemented. However, it is actually difficult for the backlight unit to be implemented as a curved structure formed of a flexible material. Although the backlight unit is implemented as a curved shape, it is difficult for light to be uniformly applied to the liquid crystal, thereby changing brightness of the screen.

On the other hand, the LED or the OLED is designed in a manner that each of constituent elements constructing the pixels can self-emit light without using the backlight unit, so that the LED or the OLED can be implemented as a curved shape without any problems. In addition, since each element can perform self-emission of light, brightness of each element is not affected by a change in the positional relationship between the element and adjacent elements, so that a curved display module 150 can be implemented as an LED or OLED.

OLED (Organic Light Emitting Diode) panels appeared in earnest in mid-2010 and are rapidly replacing LCDs in the small- and medium-sized display market. The OLED is a display made using the self-emission characteristics in which OLED emits light when a current flows in a fluorescent organic compound. Since the response speed of the OLED is faster than that of the LCD, there is little afterimage when moving images are implemented.

OLEDs may be used as a light-emitting display product. In this case, the light-emitting display device may use three fluorescent organic compounds (such as red, green, and blue) each having a self-emitting function, and may use the self-emitting phenomenon in which positive (+)-charged particles and electrons injected from a cathode and anode are combined with each other within the organic material, so that a backlight unit causing degradation of color sense need not be used.

The LED panel is implemented by technology for using only one LED element as one pixel, and has a smaller LED element compared to the prior art, so that a curved display module 150 can be implemented. Whereas the conventional device referred to as an LED TV can use the LED as a light source of the backlight unit for supplying light to the LCD, it is impossible for the LED of the conventional device to constitute a screen.

The display module may include a display panel, a coupling magnet located on the rear surface of the display panel, a first power-supply unit, and a first signal module. The display panel may include a plurality of pixels (R, G, B). The plurality of pixels (R, G, B) may be formed in each region where a plurality of data lines and a plurality of gate lines cross each other. The plurality of pixels (R, G, B) may be arranged in a matrix.

For example, the plurality of pixels (R, G, B) may include a red (R) sub-pixel, a green (G) sub-pixel, and a blue (B) sub-pixel. The plurality of pixels (R, G, B) may further include white (W) sub-pixel(s).

In the display module 150, one side where an image is displayed may be referred to as a front side or a front surface. When the display module 150 displays an image, one side where no image is observed may be referred to as a rear side or a rear surface.

Meanwhile, the display 150 may be implemented as a touchscreen, so that the display 150 can also be used as an input device in addition to an output device.

The audio output unit 160 may receive a voice-processed signal from the controller 180, and may output the received signal as a voice signal.

The interface unit 170 may serve as a path of connection to various kinds of external devices connected to the display device 100. The interface unit may include not only a wired method for transmitting/receiving data through a cable, but also a wireless method using the antenna.

The interface unit 170 may include at least one of a wired/wireless headset port, an external charger port, a wired/wireless data port, a memory card port, a port connected to a device having an identification module, an audio input/output (I/O) port, a video I/O port, and an earphone port.

As an example of a wireless method, the above-described broadcast reception unit 110 may be used. The broadcast reception unit 110 may be configured to use a broadcast signal, a mobile communication short-range communication signal, a wireless Internet signal, and the like.

The external device interface unit 171 may transmit or receive data to and from a connected external device. To this end, the external device interface unit 171 may include an A/V input/output (I/O) unit (not shown).

The external device interface unit 171 may be wired or wirelessly connected to an external device such as a digital versatile disc (DVD) player, a Blu-ray player, a game console, a camera, a camcorder, a computer (laptop), a set-top box, or the like, and may perform an input/output (I/O) operation with the external device.

In addition, the external device interface unit 171 may establish a communication network with various remote controllers 200, may receive a control signal related to operation of the display device 100 from the remote controller 200, or may transmit data related to operation of the display device 100 to the remote controller 200.

The external device interface unit 171 may include a wireless communication unit (not shown) for short-range wireless communication with other electronic devices. Through the wireless communication unit (not shown), the external device interface unit 171 may exchange data with an adjacent mobile terminal. In particular, the external device interface unit 171 may receive device information, application information, an application image, and the like from the mobile terminal in a mirroring mode.

The network interface unit 172 may provide an interface for connecting the display device 100 to a wired/wireless network including the Internet network. For example, the network interface unit 172 may receive content or data provided by the Internet, a content provider, or a network administrator through a network. The network interface unit 172 may include a communication module (not shown) for connection with the wired/wireless network.

The external device interface unit 171 and/or the network interface unit 172 may include a communication module for short-range communication such as Wi-Fi, Bluetooth, Bluetooth low energy (BLE), ZigBee, Near Field Communication (NFC), and a communication module for cellular communication such as Long-Term Evolution (LTE), LTE-A (LTE Advanced), Code Division Multiple Access (CDMA), WCDMA (wideband CDMA), UMTS (universal mobile telecommunications system), WiBro (Wireless Broadband), etc.

The user input interface unit 173 may transmit user input signals to the controller 180, or may transmit signals received from the controller 180 to the user. For example, the user input interface unit 173 may transmit or receive user input signals (such as a power-on/off signal, a channel selection signal, and a screen setting signal) to and from the remote controller 200, may transmit user input signals received through a local key (not shown) such as a power key, a channel key, a volume key, and a setting key to the controller 180, may transmit a user input signal received by a sensor unit (not shown) for sensing a user gesture to the controller 180, or may transmit a signal received from the controller 180 to the sensor unit.

The controller 180 may include at least one processor, and may control the overall operation of the display device 100 using the processor included therein. Here, the processor may be a general processor such as a CPU. Of course, the processor may be a dedicated device such as an ASIC, or other hardware-based processor.

The controller 180 may demultiplex the stream received through the tuner unit 111, the demodulator 112, the external device interface unit 171, or the network interface 172, and may process the demultiplexed signals to generate and output a signal for image or voice output.

The image signal processed by the controller 180 may be input to the display 150 and displayed as an image corresponding to the corresponding image signal. In addition, the image signal processed by the controller 180 may be input to the external output device through the external device interface unit 171.

The voice (or audio) signal processed by the controller 180 may be audibly output to the audio output unit 160. In addition, the voice signal processed by the controller 180 may be input to the external output device through the external device interface unit 171. Although not shown in FIG. 2, the controller 180 may include a demultiplexer, an image processor, and the like, and a detailed description thereof will hereinafter be described with reference to FIG. 3.

In addition, the controller 180 may control the overall operation of the display device 100. For example, the controller 180 may control the tuner unit 111 to select a broadcast program corresponding to either a user-selected channel or a prestored channel.

In addition, the controller 180 may control the display device 100 by a user command or an internal program received through the user input interface unit 173. The controller 180 may control the display 150 to display an image. In this case, the image displayed on the display 150 may be a still image or a moving image, and may be a 2D image or a 3D image.

On the other hand, the controller 180 may display a predetermined 2D object in the image displayed on the display 150. For example, the object may be at least one of a connected web screen (newspaper, magazine, etc.), electronic program guide (EPG), various menus, widgets, icons, still images, moving images, and text.

Meanwhile, the controller 180 may modulate and/or demodulate the signal using an amplitude shift keying (ASK) scheme. Here, the ASK scheme may refer to a method for modulating a signal by differentiating the amplitude of a carrier wave according to data values or for restoring an analog signal to a digital data value according to the amplitude of the carrier wave.

For example, the controller 180 may modulate an image signal using the ASK scheme, and may transmit the modulated signal through a wireless communication module.

For example, the controller 180 may demodulate and process the image signal received through the wireless communication module using the ASK scheme.

Accordingly, the display device 100 may simply transmit and receive signals to and from other image display devices arranged adjacent to each other without using either a unique identifier such as a Media Access Control (MAC) address or a complex communication protocol such as TCP/IP.

On the other hand, the display device 100 may further include a photographing unit (not shown). The photographing unit may photograph a user. The photographing unit may be implemented as one camera, but is not limited thereto, and may be implemented by a plurality of cameras. On the other hand, the photographing unit may be embedded in the display device 100 or may be separately arranged on the display 150. The image information photographed by the photographing unit may be input to the controller 180.

The controller 180 may recognize the position of the user based on the image photographed by the photographing unit. For example, the controller 180 may recognize a distance (z-axis coordinates) between the user and the display device 100. In addition, the controller 180 may recognize the X-axis coordinate and the Y-axis coordinate within the display 150 corresponding to the user position.

The controller 180 may sense a user gesture based on an image photographed by the photographing unit, each of signals detected by the sensor unit, or a combination thereof.

The power-supply unit 190 may supply corresponding power to the display device 100. In particular, the controller 180 may be implemented as a System on Chip (SoC), a display 150 for displaying an image, and an audio output unit 160 for audio output.

Specifically, the power-supply unit 190 may include a converter (not shown) for converting AC power into DC power, and a DC/DC converter (not shown) for converting the level of DC power.

On the other hand, the power-supply unit 190 may receive power from the external power source, and may distribute the received power to the respective components. The power-supply unit 190 may be directly connected to the external power source to supply AC power, and may include a battery capable of being charged with electricity.

In the former case, the power-supply unit 190 may be used by connecting to a wired cable, and it is difficult for the power-supply unit 190 to move from one place to another place, and the movement range of the power-supply unit 190 is limited. In the latter case, the power-supply unit 190 can move from one place to another place, but the weight and volume of the power-supply unit 190 may increase as much as the weight and volume of the battery. In addition, for charging, the power-supply unit 190 should be directly connected to a power cable for a predetermined period of time or should be coupled to a charging cradle (not shown) for power supply.

The charging cradle may be connected to the display device through a terminal exposed to the outside. Alternatively, if the power-supply unit 190 approaches the charging cradle using a wireless interface, a built-in battery of the power-supply unit 190 may also be charged with electricity.

The remote controller 200 may transmit a user input to the user input interface unit 173. To this end, the remote controller 200 may use Bluetooth, Radio Frequency (RF) communication, infrared (IR) communication, Ultra-Wideband (UWB), ZigBee, or the like. In addition, the remote controller 200 may receive the image, voice, or data signal output from the user input interface unit 173, and may display or audibly output the received image, voice, or data signal.

On the other hand, the above-described display device 100 may be a fixed or mobile digital broadcast receiver capable of receiving digital broadcast signals.

Meanwhile, the block diagram of the display device 100 shown in FIG. 1 is disclosed for only for illustrative purposes for one embodiment of the present disclosure, and the respective components of the display device 100 shown in FIG. 1 can be integrated, added or omitted according to the specifications of the digital device 100 which is actually implemented.

That is, if necessary, two or more components may be combined into one component, or one component may be subdivided into two or more components. In addition, the functions performed in each block are intended to explain the embodiment of the present disclosure, and the specific operation or device does not limit the scope of the present disclosure.

FIG. 2 is a perspective view illustrating an example of the display device according to an embodiment of the present disclosure.

Referring to FIG. 2, the display device 100 may have a rectangular body 100' including a first long side (LS1), a second long side (LS2) facing the first long side (LS1), a first short side (SS1) adjacent to the first long side (LS1) and the second long side (LS2), and a second short side (SS2) facing the first short side (SS1).

Here, the first short side area (SS1) is referred to as a first side area. The second short side area (SS2) is referred to as a second side area facing the first side area. The first long side area (LS1) is referred to as a third side area that is adjacent to the first side area and the second side area while being disposed between the first side area and the second side area. The second long side area (LS2) is referred to as a fourth side area that is adjacent to the first side area and the second side area while being disposed between the first side area and the second side area.

In addition, although the length of the first and second long sides LS1 and LS2 is longer than the length of the first and second short sides SS1 and SS2 as shown in FIG. 2, the scope of the present disclosure is not limited thereto, and the length of the first and second long sides LS1 and LS2 may also be approximately the same as the length of the first and second short sides SS1 and SS2 as needed.

In addition, the first direction (DR1) may be a direction parallel to each of the long sides LS1 and LS2 of the display device 100, and the second direction (DR2) may be a direction parallel to each of the short sides SS1 and SS2 of the display device 100. The third direction (DR3) may be a direction perpendicular to the first direction (DR1) and/or the second direction (DR2).

From another point of view, the side where the display device 100 displays an image may be referred to as a front side or a front surface. When the display device 100 displays an image, the side where no image is observed may be referred to as a back side or a back surface. When the display device 100 is viewed from the front side or the front surface, the first long side (LS1) may be referred to as an upper side or an upper surface. Similarly, the second long side (LS2) may be referred to as a lower side or a lower surface. Similarly, the first short side (SS1) may be referred to as a right side or a right surface, and the second short side (SS2) may be referred to as a left side or a left surface.

In addition, the first long side (LS1), the second long side (LS2), the first short side (SS1), and the second short side (SS2) may be referred to as an edge of the display device 100. A point where the first long side (LS1), the second long side (LS2), the first short side (SS1), and the second short side (SS2) meet each other may be referred to as a corner. For example, a point where the first long side (LS1) and the first short side (SS1) meet each other may be referred to as a first corner (C1). A point where the first long side (LS1) and the second short side (SS2) meet each other may be referred to as a second corner (C2). A point where the second short side (SS2) and the second long side (LS2) meet each other may be referred to as a third corner (C3). A point where the second long side (LS2) and the first short side (SS1) meet each other may be referred to as a fourth corner (C4).

Here, the direction from the first short side (SS1) to the second short side (SS2) or the direction from the second short side (SS2) to the first short side (SS1) may be referred to as a horizontal direction (LR). The direction from the first long side (LS1) to the second long side (LS2) or from the second long side (LS2) to the first long side (LS1) may be referred to as a vertical direction (UD).

The display device 100 according to the present disclosure may change the shape of the display module 150 using the LED or OLED instead of a liquid crystal, as shown in FIG. 2(a) or FIG. 2(b). That is, the backlight unit may be omitted, and the display device can be changed in shape within a predetermined range, so that the curved display device 100 can be implemented as shown in FIG. 2(b) using the above-described characteristics.

The display device 100 according to the present disclosure is a variable display device 100 in which a user can adjust a curvature according to a situation, rather than a curved display device fixed in a curved state. The display device 100 may further include a curvature adjustment unit capable of changing a curvature of the main body 100' configured to include the display module 150.

Figure 3:
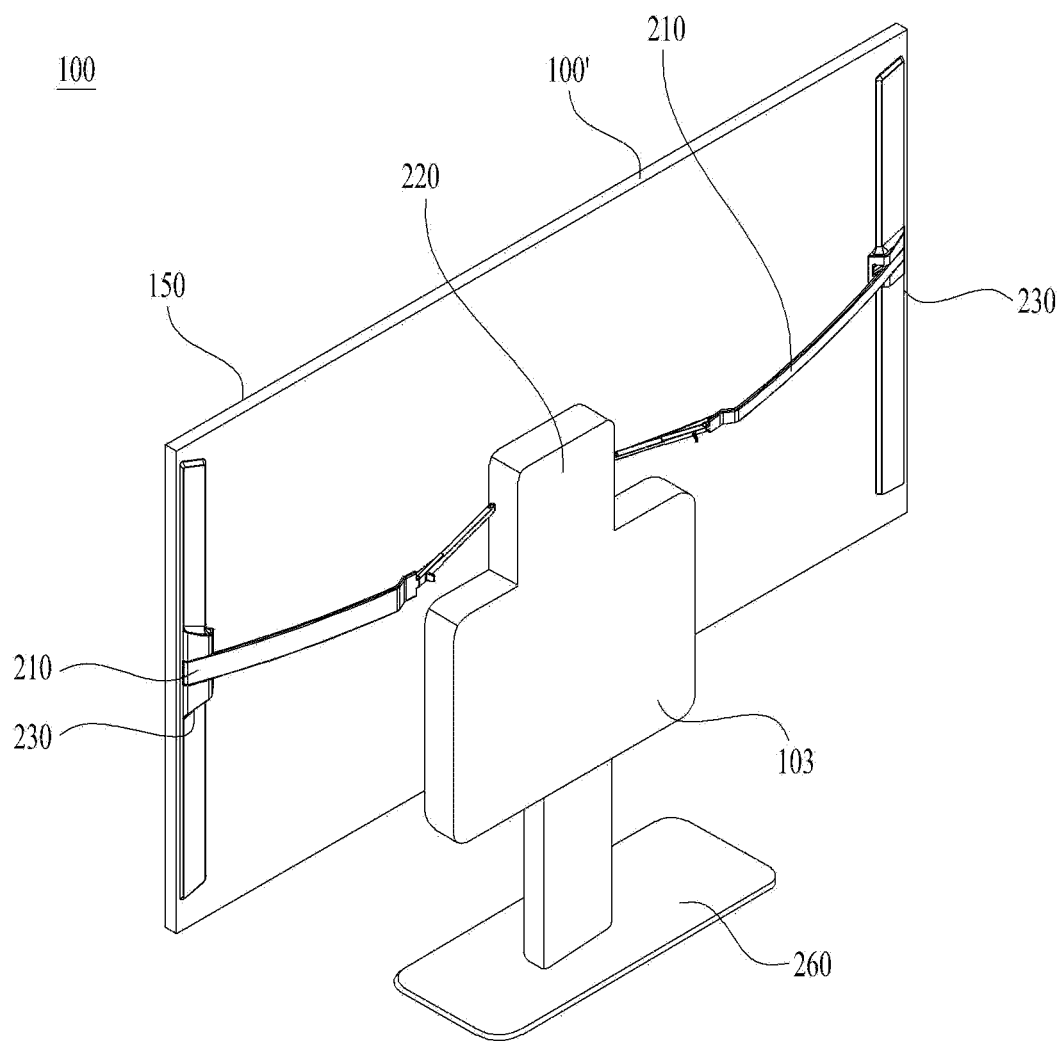
FIG. 3 is a rear view illustrating a display device according to an embodiment of the present disclosure.
Figure 4:
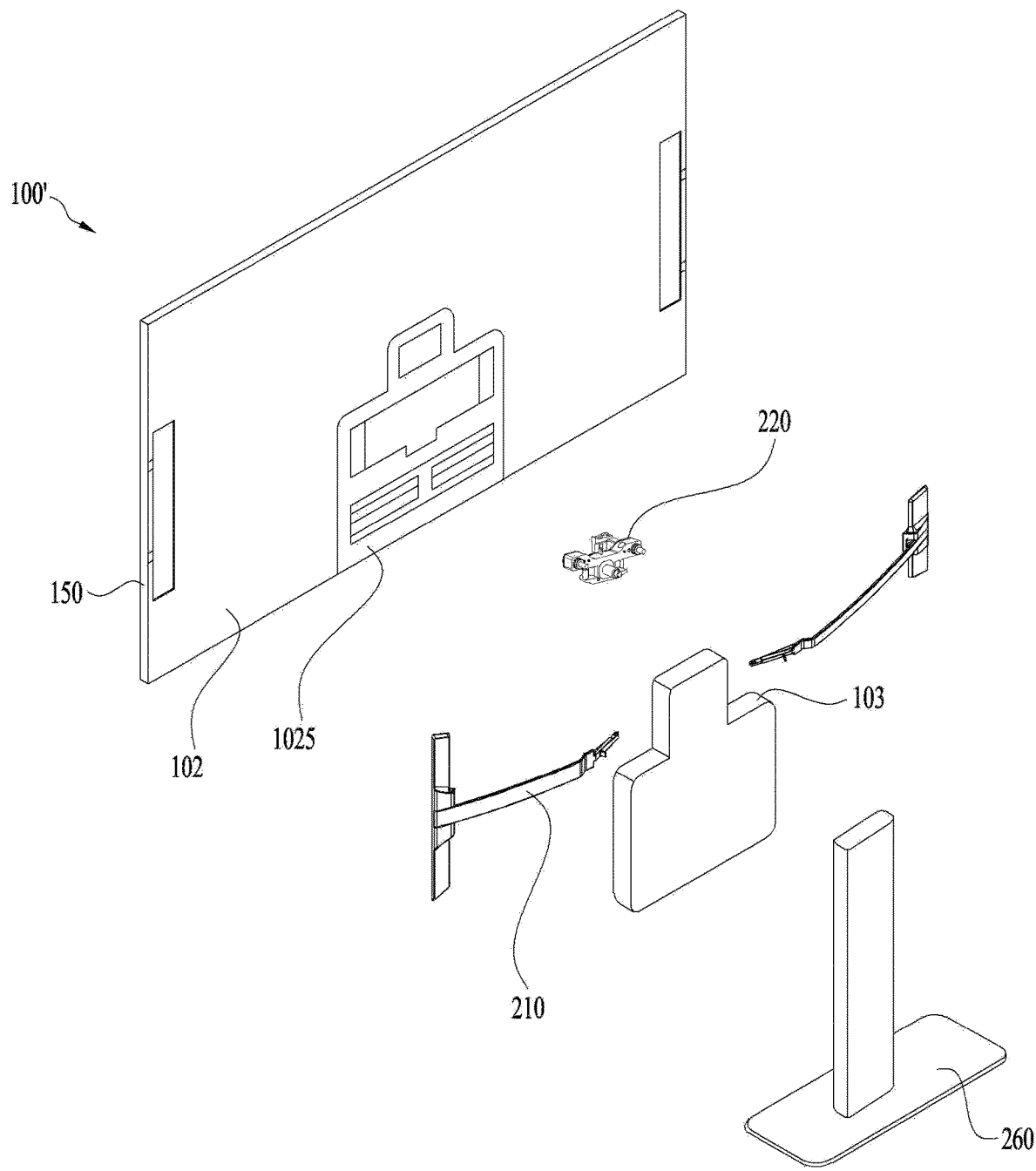
FIG. 4 is an exploded perspective view illustrating a display device according to an embodiment of the present disclosure.

FIG. 3 is a rear view illustrating the display device 100 according to an embodiment of the present disclosure. FIG. 4 is an exploded perspective view illustrating the display device 100 according to an embodiment of the present disclosure. Referring to FIGS. 3 and 4, the display device 100 may include a main body 100', a stand 260 for mounting the main body 100' on the floor, a controller 180, and curvature adjustment units 210, 220, and 230.

The main body 100' including the display module 150 may include a cover bottom 102 that covers a back surface of the display module 150 to which an image is output. A heat dissipation structure for discharging heat generated by the display module 150 may be provided at the inner surface of the cover bottom 102, and the main body 100' may further include a reinforcing material for reinforcing rigidity.

The cover bottom 102 may cover the back surface of the display module 150, may reinforce the rigidity of the display module 150, and may protect the back surface of the display module 150. In particular, the display module 150 may cover a driving IC of the display extending in a backward direction of the display module 150. A main substrate may be mounted on the back surface of the cover bottom 102 as a controller for controlling the display module 150, and a hole may be formed in the cover bottom 102 to interconnect the main substrate and the driving IC of the display module 150.

A separate bracket 1025 may be further provided so that the controller 180, such as a main board, can be mounted thereto. The display device 100 according to the present disclosure may further include a curvature adjustment unit for changing the curvature of the main body 100' other than the controller for controlling the display module 150 on the back surface of the cover bottom 102.

The curvature adjustment unit may further include a pair of links 210, a bending module 220 located at the center of the display device 100 and coupled to one end of the pair of links 210, and a pair of link brackets 230 disposed between the other end of the pair of links 210 and the cover bottom 102.

Figure 5:
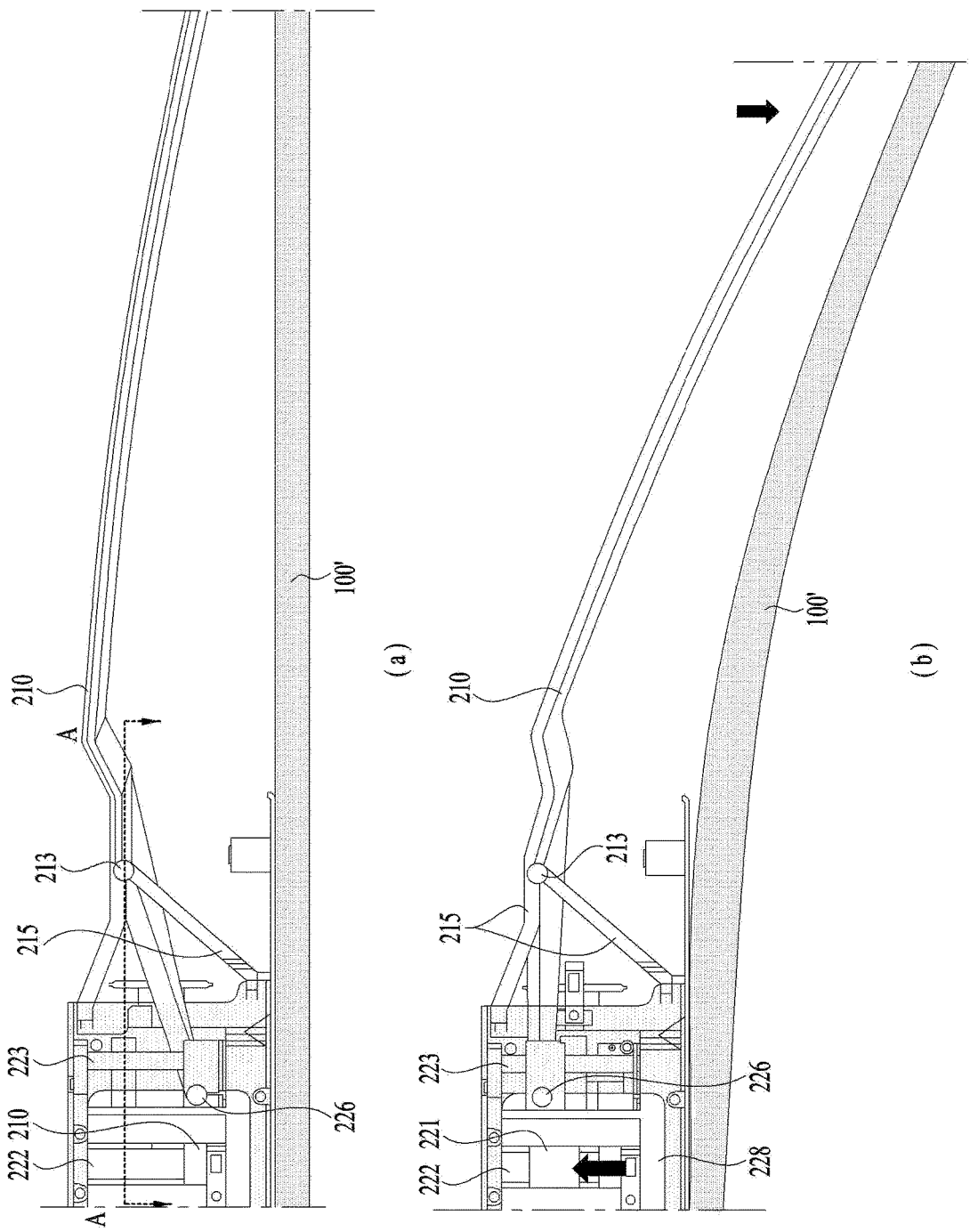
FIG. 5 is a top view illustrating a display device according to an embodiment of the present disclosure.

FIG. 5 is a top view illustrating the display device 100 according to an embodiment of the present disclosure. As shown in FIGS. 5(a) and 5(b), the curvature of the display device 100 may be changed according to the angle formed by the pair of links 210. The angle of the pair of links 210 may be adjusted according to a change in the position of the moving block 221 of the bending module 220.

The other end of the pair of links 210 may be slidably coupled to the link bracket 230. When the link bracket 230 is fixed to the link bracket 230, the curvature of the display module 150 is large at the end thereof so that it is difficult to implement a natural curved surface of the display module 150.

Accordingly, if the angle of the pair of links 210 is adjusted by the bending module 220, the other end of the link 210 slidably moves on the link bracket 230, so that a natural curved surface of the display module 150 can be implemented.

The bending module 220 may include a moving block 221 connected to one end of the link 210 and movable forward and backward, a guide shaft 222 for guiding the moving block 221 to move forward and backward without moving in the horizontal direction, and a module bracket 228 for receiving the bending module 220.

The link 210 is rotatably coupled to the link fixing unit 215 extending from the bending module 220. The link 210 may rotate around the link fixing pin 213 fastened to the link fixing unit 215, and one end and the other end of the link 210 may move in opposite directions.

When the user pulls the horizontal ends SS1 and SS2 of the main body 100' in a forward direction, the bending module 220 may allow the other end of the link 210 located on the horizontal ends SS1 and SS2 of the main body 100' to move in a forward direction, the link 210 may rotate around the link fixing pin 213, and one end of the link 210 may move in a backward direction.

In contrast, when the user pushes the horizontal ends SS1 and SS2 of the main body 100' in a backward direction so as to use the display device as a flat display, the other end of the link 210 may move backward and one end of the link 210 may move forward. A coupling position of the link fixing pin 213 may be located closer to one end of the link 210 than the other end of the link 210, and the movement distance of one end of the link 210 may be shorter than the movement distance of the other end of the link 210.

As described above, the user may manually change the curvature of the display device 100 by applying force to the horizontal ends SS1 and SS2 of the main body 100. At this time, the pair of links 210 is synchronized with the bending module 220 and simultaneously moved. As a result, the other side SS2 can also move at the same time when the user pulls or presses one side SS1 of the main body 100'.

However, according to the manual driving method, the user may apply force directly to the display module 150, there is a high risk of damage to the display module 150, and a motor is provided in the bending module 220, so that the curvature of the display module 150 can be changed.

For example, the guide shaft 222 may be formed in a spiral shape, and a spiral groove corresponding to the spiral of the guide shaft 222 may be formed in the moving block 221. When the motor rotates the guide shaft 222, the moving block 221 may move forward and backward.

When the moving block 221 of the bending module 220 moves backward, one end of the link 210 coupled to the moving block 221 moves backward, the other end of the link 210 moves forward, and the angle of the pair of links 210 may vary. The bending module 220 may induce a change in the angle of the links 210, and the display module 150 may again transition to the bent state or the flat state.

The display device 100 may further include a back cover 103 for covering the bending module 220 and the controller, and may further include a stand 260 for holding the main body 100' of the display device 100 on the floor. Instead of the stand 260, the display device 100 may further include a wall bracket that can be installed on the wall, and the stand 260 and the wall bracket may be coupled to the back cover 103.

Referring to FIG. 5, the moving block 221 according to the present embodiment may move forward and backward along the guide shaft 222 protruding from the back surface of the main body 100'. One end of the link 210 may be coupled to the moving block 221, and may be rotatably coupled to the moving block 221 through the operation pin 226 to change the angle thereof according to movement of the moving block 221.

FIG. 6 is a view illustrating a fastened state of the link 210 and the link bracket 230 of the display device 100. (a) shows the other end of the link 210 and the link bracket 230 in a state in which the display module 150 is flat, and (b) shows the link 210 and the link bracket 230 in a state in which the display module 150 is bent.

FIG. 7 is an exploded perspective view of the link 210 and the link bracket 230 of the display device 100. The link bracket 230 may include a fastening plate 237 coupled to a back surface of the main body 100', a link side block 235 coupled to the fastening plate 237, and a movable bar 233 coupled to the other end of the link 210 and in contact with the link side block 235.

The fastening plate 237 may be coupled to the cover bottom 102 of the main body 100', and, as shown in FIG. 7, may be screwed at an end thereof in a horizontal direction and may be of a metal material such as aluminum.

The link side block 235 may generate noise due to friction between metals when the link 210 is in direct contact with the fastening plate 237. Therefore, the link side block 235 made of a friction-resistant and lubricating material such as poly oxy methylene (POM) may be used in a portion where the other end of the link 210 slides.

The link side block 235 may be fixed to the fastening plate 237, and may have a smaller area than the fastening plate 237.

Because the link 210 is the metal and the link side block 235 is a relatively weak injection-molded product, there is a problem in that wear of the link side block 235 is relatively severe. The movable bar 233 made of a resin such as the poly oxy methylene may be further disposed at the other end of the link 210 to reduce the wear of the link side block 235.

In addition, because the movable bar 233 slides on the link side block 235, even when both the movable bar 233 and the link side block 235 are made of the resin, a material of the movable bar 233 may have a higher rigidity than a material of the link side block 235.

Figure 8:
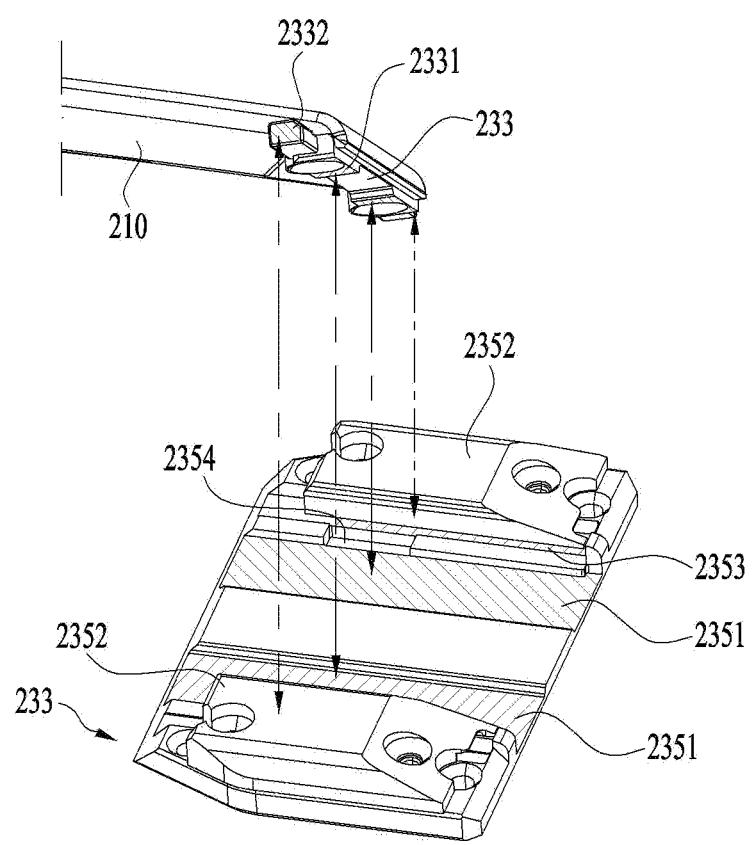
FIG. 8 is a view illustrating a contact surface between a movable bar and a link side block.

FIG. 8 is a view illustrating a contact surface between the movable bar 233 and the link side block 235. When the contact surface between the movable bar 233 and the link side block 235 is wide, the noise may occur and the slide movement may not be smooth. Thus, the movable bar 233 may include a protruding friction portion 2331 to reduce the contact surface with the link side block 235.

The link side block 235 may include a side wall 2352 facing a side surface (directed in a vertical direction of the display device 100) of the link 210 as shown in FIG. 8. The side wall 2352 may serve to support the link 210 such that the link 210 does not move in the vertical direction. Therefore, because the side wall 2352 and the link 210 are also in contact with each other, the movable bar 233 may further include the protruding friction portion 2332 even on a surface facing the side wall 2352 as shown in FIG. 8.

The link side block 235 may be entirely made of the poly oxy methylene (POM) or only surfaces 2351 and 2353 in contact with the friction portion of the movable bar 233 may use the poly oxy methylene.

A stopper 238 protruding from the link side block 235 to limit a horizontal movement distance of the link 210 may be further included. The stopper 238 may be formed on the link side block 235 to protrude or may protrude from the fastening plate 237 toward the link 210 through the link side block 235 as shown in FIG. 7.

The stopper 238 of the present embodiment is formed only at a position to limit the movement distance of the link 210 when the display device 100 is bent, but a stopper 238 located outwardly of the link 210 may be further included to stop the link 210 when a state of the display device 100 is switched to a flat state. In the present embodiment, a bracket cover 231 for covering the link side block 235 may constitute a step outwardly of the movable bar 233, so that the bracket cover 231 may replace the outwardly located stopper 238.

The bracket cover 231 is a member for covering the link side block 235 and the fastening plate 237, and covers screws or the like for fixing the link side block 235 and the fastening plate 237 so as not to be exposed. As shown in FIG. 7, only a portion of the bracket cover 231 corresponding to the link 210 may be opened such that the link 210 may move.

Figure 9:
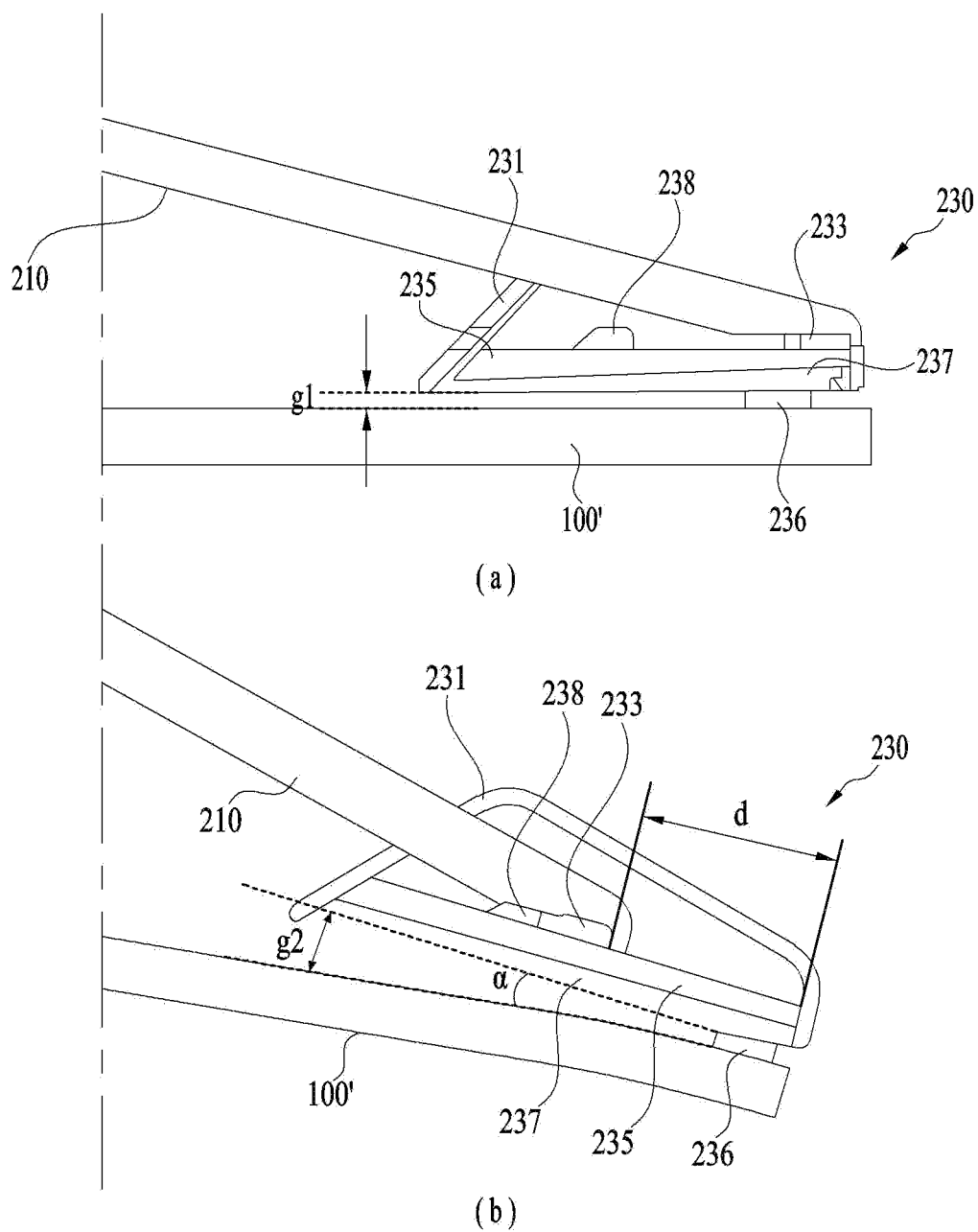
FIG. 9 is a view illustrating an embodiment of a link and a link bracket in a flat state and a curved state of a display device.

FIG. 9 is a view illustrating arrangements of the link 210 and the link bracket 230 in the flat state and the curved state of the display device 100. As shown in FIG. 9(*a*), the fastening plate 237 may be fastened with the main body 100' via a bracket fastener 236 at an end of the main body 100'. For convenience of description, a portion (a right portion in the drawing) around a horizontal end will be referred to as a first portion 230*a* of the fastening plate 237, and a portion (a left portion in the drawing) around a horizontal center will be referred to as a second portion 230*b* of the fastening plate 237.

When only the first portion 230*a* of the fastening plate 237 is fastened with the main body 100', as shown in FIG. 9, an angle α of the link bracket 230 formed on the back surface of the display module 150 may be adjusted. When the display device 100 is bent, the main body 100' is transformed into a curved surface having a predetermined curvature, but the link 210 does not change a curvature thereof but changes an arrangement direction, so that an angle of the other end of the link 210 may be different from an angle of the horizontal end of the main body 100'.

The angle of the other end of the link 210 may be greater than the angle of the horizontal end of the main body 100' (a state in which the other end of the link 210 has a greater angle with a surface of the display module 150 in the flat state than the horizontal end of the main body 100'). Therefore, when an entire surface including the second portion 230*b* of the link bracket 230 is fixed to the back surface of the main body 100' via the screw or the like, when the main body 100' is bent, the link bracket 230 is not bent, so that a press mark may appear at a portion where the link bracket 230 is coupled.

As shown in FIG. 9(*a*), the fastening plate 237 may be partially fastened via the bracket fastener 236 and the remaining portion thereof may have a variable spacing from the display module 150 such that the press mark is not visible on horizontal ends SS1 and SS2 of the display module 150 during the bending.

According to an embodiment in FIG. 9, only the first portion 230*a* may be fastened to the main body 100' via the fastener 236, and the second portion 230*b* may not be fastened via the fastener 236.

When only the end of the fastening plate 237 is fastened to the main body 100', when the main body 100' is bent as shown in FIG. 9(*b*), the second portion may compensate for a difference in angle between the other end of the link 210 and the horizontal end of the main body 100' while being spaced apart (g2>g1) from the back surface of the main body 100'.

An inclined surface may be formed on a surface of the back surface of the link bracket 230, that is, the back surface of the link side block 235, for compensating for the angular difference between the link 210 and the main body 100'. An inclination (e.g., about 2°) may be formed such that a region corresponding to the second portion further protrudes in a backward direction. That is, the angular difference between the main body 100' and the link 210 may be compensated for because of an inclination difference between the front and back surfaces of the link side block 235.

However, when the other end of the link 210 slides based on the curvature of the main body 100' as shown in FIG. 9(*b*), a position of the other end of the link 210 changes. When the main body 100' is bent, the other end of the link 210 moves from the end (the first portion 230*a*) of the link bracket 230 toward the center of the main body to be located in the second portion 230*b*, and applies a force to the second portion 230*b* of the link bracket 230.

A point at which the link 210 transmits a force to the link bracket 230 is the second portion 230*b* and the position where the main body 100' and the link bracket 230 are connected to each other is the first portion 230*a*, so that an imbalance of the force appears. More specifically, the second portion 230*b* of the link bracket 230 receives a force in a forward direction by the link 210, but a reverse force of the force applied by the link 210 acts on the first portion 230*a* to pull the horizontal end of the main body 100' in a backward direction.

That is, a curvature at the horizontal end of the main body 100' may appear different from a curvature of the remaining portion of the main body 100', and thus the curvature of the main body 100' may differ from the designed one.

FIG. 10 is a view illustrating another embodiment of the link 210 and the link bracket 230 in the flat state and the curved state of the display device 100. In order to solve the above problem, as shown in FIG. 10, the link bracket 230 and the back surface of the main body 100' may be fastened to each other via the bracket fastener 236 in the portion (the second portion) located slightly inwardly of the horizontal end.

The link bracket 230 may be coupled to the back surface of the main body 100' in a portion where the other end of the link 210 is located in the bent state. Distortion may be minimized by matching the positions of the force point and the action point of the link 210.

FIG. 11 is a diagram illustrating a method for measuring rigidity of a corner of the display device 100. As shown in (a), a crack load at which a crack occurs when pressing a corner of the display device 100 while constraining a position spaced apart by a predetermined distance (e.g., 7 cm) from the corner of the display device 100 may be measured. A rigidity of the display device 100 may be measured by measuring the crack load.

The crack may appear as shown in (b) adjacent to the constrained position. When the crack occurs at a load equal to or lower than a reference load, there is a risk of easy damage, so that the rigidity of the display device 100 must be reinforced.

The bendable display device 100 may have thicknesses and rigidities of the display module 150 and structures (an inner sheet and a cover bottom) for supporting the back surface of the display module 150 smaller than those in the flat display device 100 so as to be bendable.

A crack load of the conventional bendable display device 100 is 5.8 kgf, which is lower than a reliability standard of 25 kgf, so that structural improvement is required.

When the inner plate or the cover bottom is made of material high rigidity or the thickness thereof is increased to improve the rigidity of the display device 100, a greater force is required for the bending or a deformation range is limited.

In order to realize a structure that may be bent while securing the rigidity of the corner of the display device 100 that is easily exposed to the external impact or the like at the same time, the corner rigidity may be improved using structures of the middle frame and the link bracket 230 while maintaining the materials and the thicknesses of the display module, the inner sheet, and the cover bottom that are directly subjected to the bending deformation.

Figure 12:
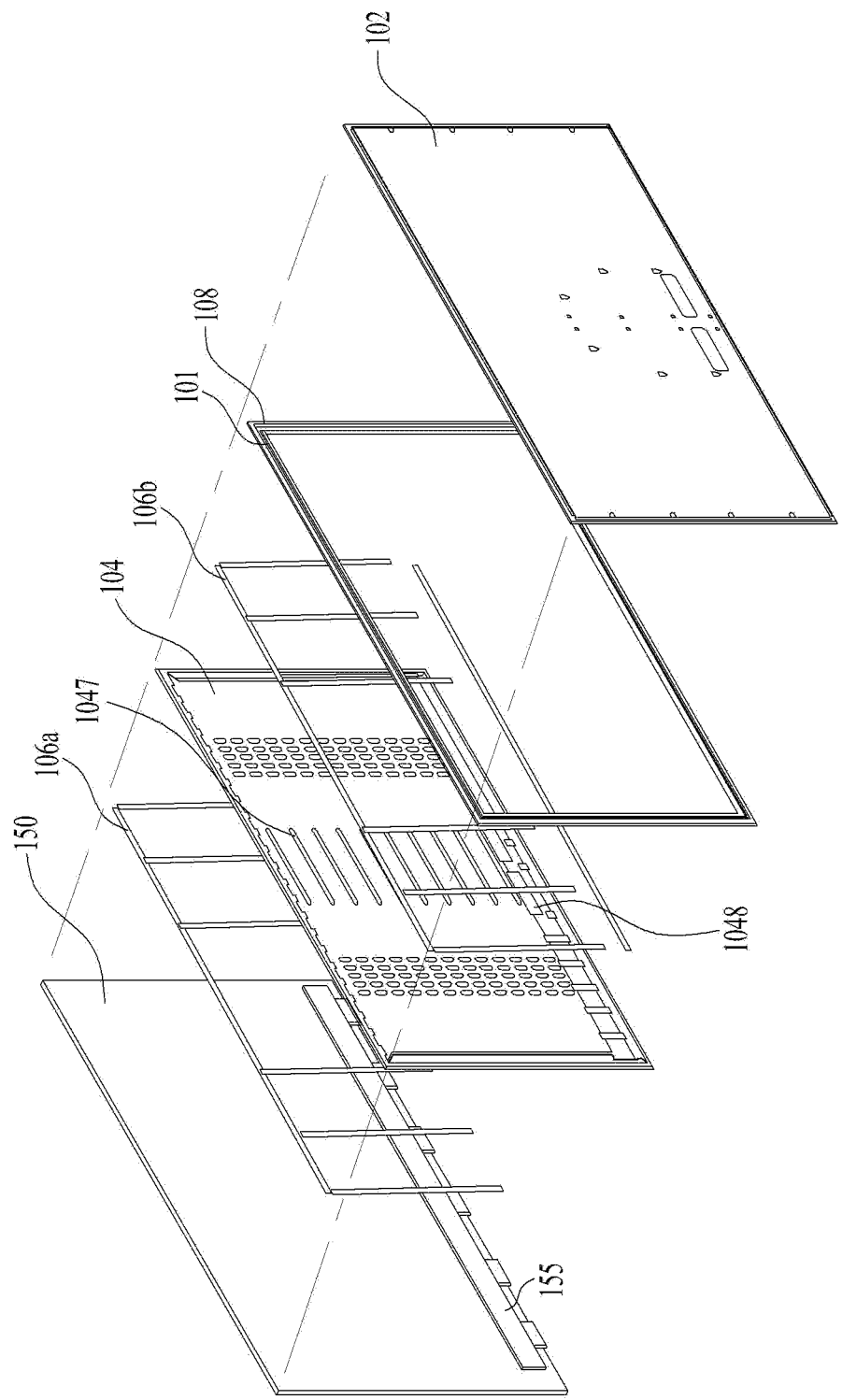
FIG. 12 is an exploded perspective view according to an embodiment of a display device.
Figure 13:
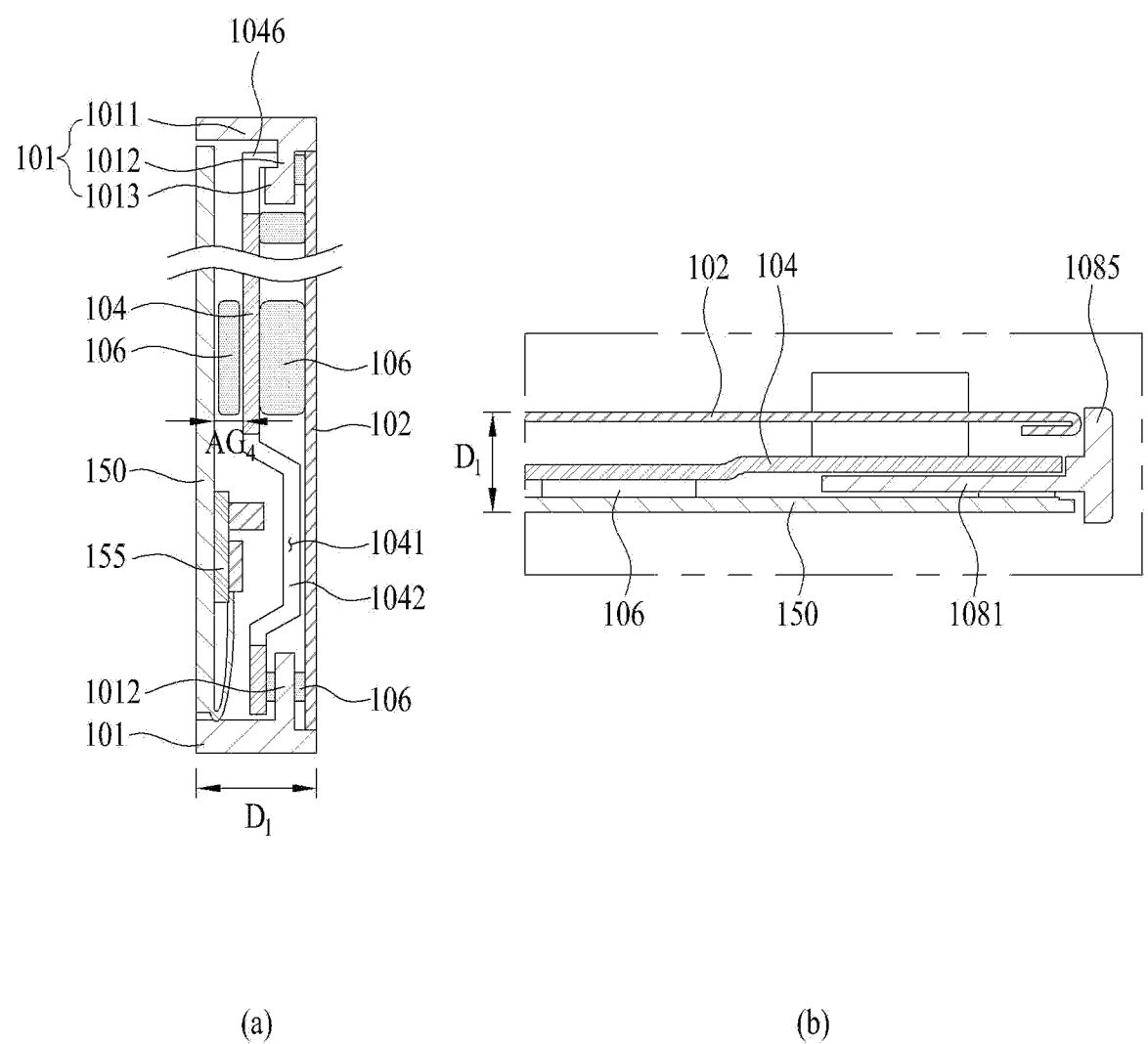
FIG. 13 is a cross-sectional view of a horizontal end according to an embodiment of a display device.

FIG. 12 is an exploded perspective view of the main body 100' of the display device 100, and FIG. 13 is a view illustrating an example of the display device 100.

The display device 100 of the present disclosure may further include an inner sheet 104 between the cover bottom 102 and the display module 150 to solve a heat dissipation problem and the rigidity problem and implement a flat back surface structure at the same time.

In order to implement the bendable display device 100, an element without a backlight such as the bendable LED or OLED must be used as the display module 150, and the structures 102 and 104 for covering the back surface of the display module 150 must also be bendable.

The display device 100 of the present disclosure may include the display module 150 for outputting an image, the inner sheet 104 positioned on the back surface of the display module 150, and the cover bottom 102 that constitutes the back surface of the main body 100' of the display device 100. In addition, the display device 100 may further include middle cabinets 101 and 108 positioned around side surfaces of the display module 150, the inner sheet 104, and the cover bottom 102 to form an appearance of a side surface of the main body 100'.

As shown in FIG. 13(*a*), the inner sheet 104 may be positioned adjacent to the back surface of the display module 150 to reduce a size of a gap AG4 to prevent stagnating of the heat. It is advantageous in terms of the heat dissipation when the size of the gap between the inner sheet 104 and the display module 150 is smaller than a size of a gap between the inner sheet 104 and the cover bottom 102.

In addition, the inner sheet 104 may also be made of the metal material with the high thermal conductivity to obtain a heat dissipation effect.

A first region 1042, which is a portion corresponding to a drive IC 155 of the inner sheet 104, may protrude in the backward direction to avoid interference with the drive IC 155. Instead, in the display device 100 of the present disclosure, the cover bottom 102 forms the flat surface and covers the inner sheet 104, so that the first region curve 1042 of the inner sheet 104 does not affect the exterior design.

When the curve is formed, a rigidity of the first region 1042 increases, but bending of the first region 1042 becomes difficult instead. When a plurality of first holes 1041 spaced apart from each other in the horizontal direction are defined in the first region 1042 as shown in FIG. 13(*b*), the inner sheet 104 may be bent as the first hole 1041 is widened corresponding to the curvature of the main body 100'.

Each of the members 150, 101, 102, 104, and 108 may be attached to each other using a double-sided adhesive tape 106. The members may be partially fastened to each other using the fastener such as the screw, but the use of the fastener may be restricted to realize the display device 100 that is thin and minimizes the visible fasteners.

Because the display module 150 and the inner sheet 104 are light, the display module 150 and the inner sheet 104 may maintain the attached state without falling via the limited number of fasteners and an adhesive force of the adhesive tape 106.

Adhesive tapes 106*a* and 106*b* may be respectively located between the display module 150 and the inner sheet 104 and between the inner sheet 104 and the cover bottom 102 and the adhesive tape 106 has an elasticity of a predetermined degree, so that, when the curvature is changed, slip of the members due to a difference in the radius of curvature may be compensated for.

When the adhesive tape 106 extends long in the horizontal direction, an error resulted from the slip is accumulated and an amount of deformation increases at the end, so that, as shown in FIG. 12, the adhesive tapes 106*a* and 106*b* that is long in the vertical direction may be used.

The adhesive tapes 106 positioned on the front and back surfaces of the inner sheet 104 may vary depending on the spacing between the inner sheet 104 and the display module 150 and the spacing between the inner sheet 104 and the cover bottom 102.

As shown in FIG. 13(*a*), the inner sheet 104 may be disposed to be biased toward the display module 150 except for a portion where the drive IC 155 is located. Accordingly, a thickness of the first adhesive tape 106*a* positioned on the front surface of the inner sheet 104 may be smaller than a thickness of the second adhesive tape 106*b* positioned on the back surface of the inner sheet 104.

When a thickness of the cover bottom 102 is increased to ensure the rigidity, the bending becomes difficult. However, as in the present disclosure, when the display back surface structure is composed of two sheets of the inner sheet 104 and the cover bottom 102, the bending deformation is possible while securing the rigidity.

Because the inner sheet 104 and the cover bottom 102 are attached to each other using the elastic adhesive tape 106, the slip may occur within a certain range during the bending and the main body 100' may be easily bent.

When the display device 100 is bent, the deformation appears larger from the central portion in the horizontal direction toward the left and right ends thereof, so that a circuit board as the controller 180, the bending module 220 for the bending deformation, and a stand for mounting the display device 100 may be coupled to each other in the central portion.

In this regard, a fastener for fastening the controller 180 and the bending module 220 to each other may extend through the cover bottom 102 to be also fastened to the inner sheet 104 increase a supporting force.

In order to increase a rigidity of the second region located at the horizontal center of the inner sheet 104, a bead 1047 may be formed. The bead 1047, which is obtained by pressing and processing a plate-shaped member, may increase the rigidity of the inner sheet 104 but may become a design hindrance when exposed to the outside. Because the inner sheet 104 is covered by the cover bottom 102, even when the bead 1047 is molded, it does not affect the design.

Left and right ends of the inner sheet 104 with little or no deformation may reinforce a rigidity thereof by performing folding processing. The folded portion of the inner sheet 104 may be fastened to the cover bottom 102 via the screw or the like. Because the folded portion of the inner sheet 104 becomes thick, the adhesive tape 106 may be thinner than those in other regions.

Left and right portions of the horizontal center (the second region) of the inner sheet 104 are portions in which the deformation occurs during the bending. A plurality of second holes 1044 may be defined to compensate for a difference in length based on the difference in radius of curvature between the display module 150 and the cover bottom 102 during the bending.

The second holes 1044 may be uniformly defined above the first region 1042 such that the entire area of the inner sheet 104 may be deformed in a balanced manner. The second holes 1044 may be evenly defined in the vertical direction except for the first region 1042 in which the first holes 1041 are already defined. The plurality of second holes 1044 may be arranged in the horizontal direction to sufficiently receive the deformation in the horizontal direction.

An area in which the second holes 1044 are defined in the horizontal direction may vary depending on a size and a degree of bending of the display device 100. The second holes 1044 may be symmetrically defined on left and right sides to balance the left and right deformations.

An opening 1048 through which the drive IC 155 located on the front surface of the first region 1042, the controller located on the back surface of the cover bottom 102, and a cable for connection pass may be included, and the opening 1048 may be defined in the central portion. The cover bottom 102 may also include an opening at the same position, and the opening may be connected to the controller seated on the back surface of the cover bottom 102.

The middle cabinets 101 and 108 may cause damage and plastic deformation during the bending deformation when using a member having rigidity such as metal, so that the middle cabinets 101 and 108 may be formed of an injection-molded product that is deformable within a predetermined range. Because the display device 100 changes in the curvature in the horizontal direction, but does not change in the curvature in the vertical direction, the horizontal middle cabinets 101 positioned at the top and the bottom and the vertical middle cabinets 108 extending in the vertical direction may have different structures and may be molded with different materials.

The horizontal middle cabinet 101 may include an exposed portion 1011 for covering the side surface perimeter, and a rib 1012 extending inward. The rib 1012 may be located between the inner sheet 104 and the cover bottom 102 or located on the front surface of the inner sheet 104 as a member for fixing the horizontal middle cabinet 101 by being coupled with the inner sheet 104 and the cover bottom 102.

The rib 1012, the inner sheet 104, and the cover bottom 102 may be fastened to each other using the adhesive tape 106. In order to increase a fastening force, a first hook 1013 may be formed at an end of the rib 1012, and a second hook 1046 may be molded by bending an end of the inner sheet 104 and fastened with the first hook 1013. When the second hook 1046 is continuous, it interferes with the bending of the inner sheet 104, so that a slit may be defined in an upper portion of the inner sheet 104 to facilitate the bending.

An upper rib 1012 may be located on the front surface of the inner sheet 104, a lower rib 1012 may be located between the inner sheet 104 and the cover bottom 102. When the rib 1012 is located on the front surface of the inner sheet 104, in order to also secure a fastening force with the cover bottom 102, the rib 1012 may be fastened to the cover bottom 102 exposed through the upper slit defined in the inner sheet 104 via the adhesive tape 106.

However, as described above, there may not be enough space to insert the rib 1012 and form the hook between the display module 150 and the inner sheet 104 in the state in which the gap AG4 between the display module 150 and the inner sheet 104 is minimized, so that, as shown in FIG. 13(a), the first hook 1013 and the rib 1012 may be positioned between the inner sheet 104 and the cover bottom 102.

When the display device 100 is bent, the display module 150, the inner sheet 104, and the cover bottom 102 change in the radius of curvature, so that the slip may occur. The slip means a change in position in a limited range.

The layers of the layered structure of the main body 100' may be fastened to each other such that the slip may occur within a certain range in the horizontal direction. For example, as described above, the layers may be attached to each other using the adhesive tape 106 or the like to compensate for the position difference resulted from the slip.

Even when the layers are fastened to each other using the separate fastener, the layers may be fastened to each other using a long hole extending in the horizontal direction to enable horizontal slip of the display module 150, the inner sheet 104, and the cover bottom 102.

Accordingly, as shown in FIG. 13(b), the vertical middle cabinet 108 may be fixed with one of the display module 150, the inner sheet 104, and the cover bottom 102, and may be coupled to the remaining members in a slip-able manner. For example, the members may be aligned by being attached to another member via the adhesive tape 106 with the elasticity or by being attached to another member via the adhesive tape 106 or the like with a structure to be directly fastened with the vertical middle cabinet 108 omitted.

Because the display device 100 changes in the curvature in the horizontal direction and does not change in the curvature in the vertical direction, the horizontal middle cabinets 101 positioned at the top and the bottom may use a material with a variable curvature, and the vertical middle cabinet 108 extending in the vertical direction may use a material with rigidity.

For example, the vertical middle cabinet 108 may use the material with the rigidity such as aluminum, and the horizontal middle cabinet 101 may use a synthetic resin material such as an ABS resin to be bent without being damaged.

The crack load may be increased from 5.8 kgf to 11.7 kgf by only using the aluminum for the vertical middle cabinet 108. However, additional structural improvements are needed to meet reliability standards.

Figure 14:
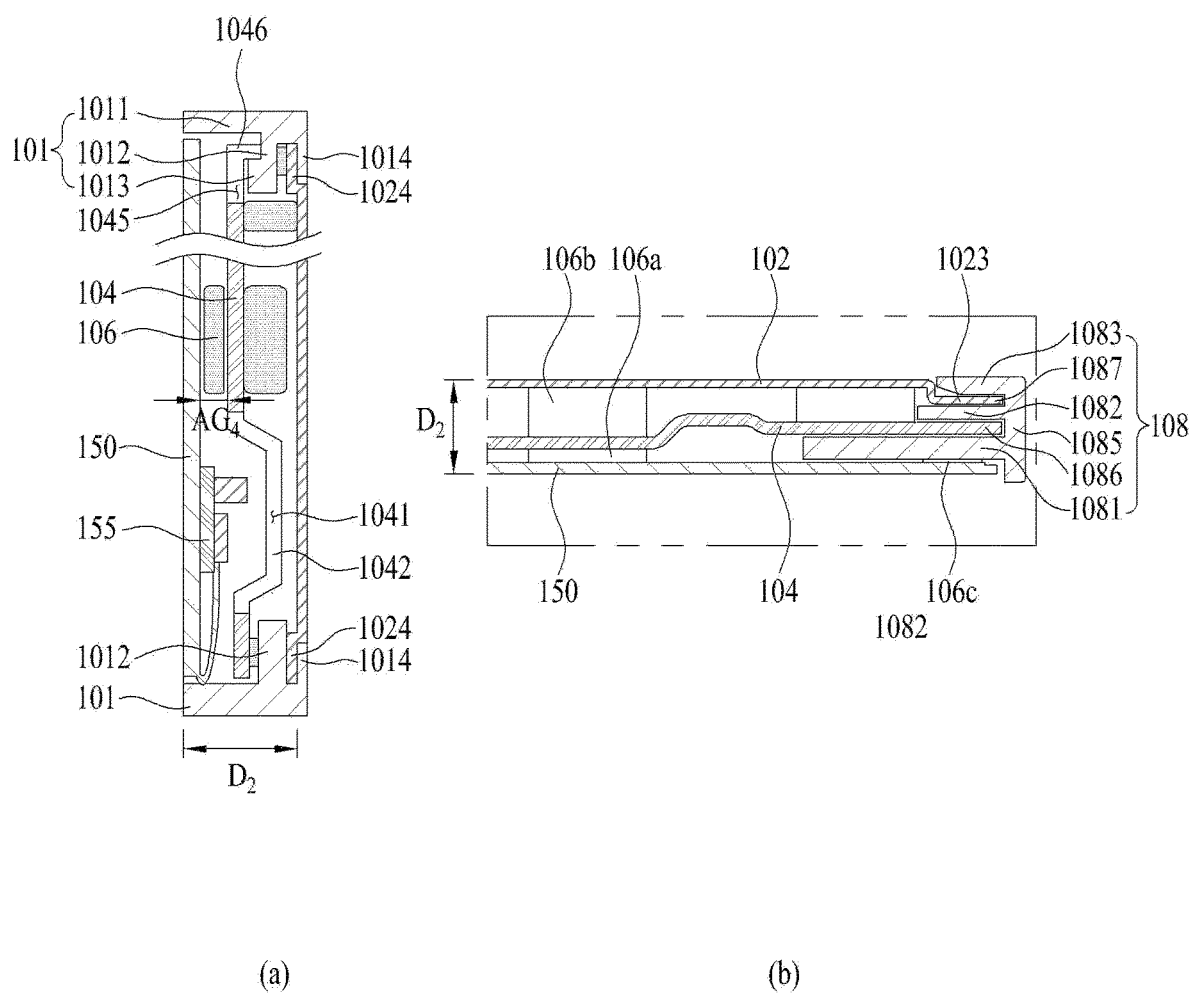
FIG. 14 is a cross-sectional view of a horizontal end according to another embodiment of a display device.

FIG. 14 is a diagram showing another embodiment of the middle cabinet of the display device 100. FIG. 14(a) is a vertical cross-sectional view showing the horizontal middle cabinet 101, and FIG. 14(b) is a horizontal cross-sectional view showing the vertical middle cabinet 108.

An embodiment in which the horizontal middle frame 101 of the present embodiment further includes a back protrusion 1014 that additionally surrounds a rear end of the cover bottom 102 in the above-described embodiment is shown. The back protrusion 1014 is a portion exposed on the back surface of the main body 100'. In order to form a uniform plane on the back surface of the main body 100', an upper or lower vertical end 1024 of the cover bottom 102 may protrude in the forward direction while forming a step of a size corresponding to that of the back protrusion 1014.

The back protrusion 1014 of the horizontal middle cabinet 101 prevents the cover bottom 102 from being spaced apart from the inner sheet 104 during the bending of the display device 100. In addition, the display device 100 may be prevented from being deformed by preventing the metal cover bottom 102 from being twisted due to thermal expansion.

The vertical end 1024 bent in consideration of plastic deformation of the cover bottom 102 during the bending of the display device 100 may define a slit to naturally induce the bending. Because the vertical end 1024 is covered by the back protrusion 1014, the slit defined in the vertical end 1024 may not be exposed to the outside.

Referring to FIG. 14(b), a back protrusion of the vertical middle cabinet 108 positioned on a side of the main body 100' fixes the horizontal end of the cover bottom 102 similar to the back protrusion of the horizontal middle cabinet 101 shown in (a).

Only the display module 150 is attached to the vertical middle cabinet 108 via the adhesive tape 106, and the inner sheet 104 and the cover bottom 102 are not directly fixed to the vertical middle cabinet 108. The inner sheet 104 and the cover bottom 102 may compensate for the difference in the radius of curvature caused by the bending while moving horizontally in a space between the exposed portion and the rib 1012 that is vertically defined such that the inner sheet 104 and the cover bottom 102 may slip in the horizontal direction.

The inner sheet 104 is coupled to the back surface of the display module 150 via the first adhesive tape 106a and the cover bottom 102 is coupled to the inner sheet 104 via the second adhesive tape 106b. When the display device 100 is bent, the adhesive tapes 106a and 106b may compensate for the amounts of slip of the members while changing the shapes thereof.

The back protrusion serves to hold the cover bottom 102 such that the cover bottom 102 is not deviated from the vertical middle cabinet 108 during the slip movement, and a horizontal width of the back protrusion of the vertical middle cabinet 108 preferably has a length equal to or greater than the slip amount of the cover bottom 102.

When the back protrusion is added as such, the thicknesses of the middle cabinet and the display device 100 may be increased in general, and the crack load of the corner may also be increased to 18.5 kgf. However, additional structural improvements are needed to meet the reliability standard of 25 kgf.

Figure 15:
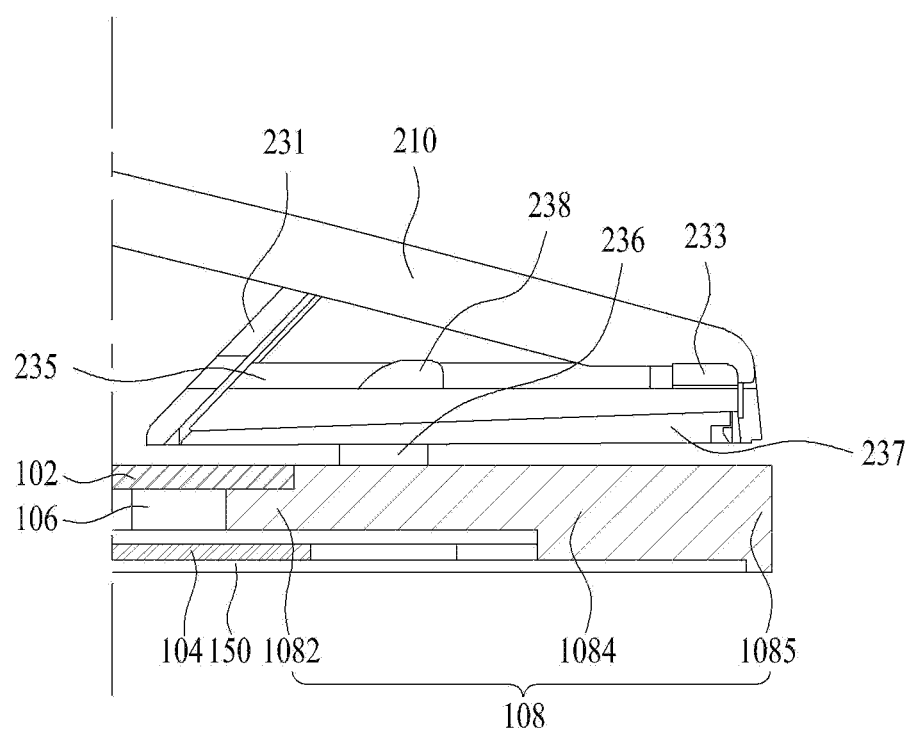
FIG. 15 is a cross-sectional view of a horizontal end according to another embodiment of a display device.

FIG. 15 is a cross-sectional view showing another embodiment of the display device 100.

The rigidity of the corner may be increased by increasing the size of the middle frame in the thickness direction as well as the size of the middle frame in the horizontal direction. Referring to FIG. 15, the middle cabinet of the present embodiment may further include a rigid portion 1084 extending from the exposed portion. A front surface of the rigid portion 1084 may be coupled with the display module 150 and exposed in the backward direction.

The rigid portion 1084 of the vertical middle cabinet 108 is extended in the horizontal direction, so that the bracket fastener 236 of the link bracket 230 described above may be coupled to the middle cabinet rather than to the cover bottom 102 or the inner sheet 104. The rigid portion 1084 of the vertical middle cabinet 108 has a predetermined thickness, so that the link bracket 230 may be fixed more stably and the main body 100' may be bent by receiving the force stably based on the change in the angle of the link 210.

The vertical middle cabinet 108 may be formed with a step such that the inner sheet 104 and the cover bottom 102 are slip-able, and may include a rib 1082.

Even when the back protrusion for covering the horizontal end of the cover bottom 102 is omitted, because the link bracket 230 is coupled to a boundary between the cover bottom 102 and the vertical middle cabinet 108, even when the position of the end of the cover bottom 102 is changed due to the slip movement, an exposure thereof to the outside may be minimized. However, when the size of the rigid portion 1084 is too large, there is a problem that the end thereof is not able to be bent, so that the size of the middle cabinet is limited.

Figure 16:
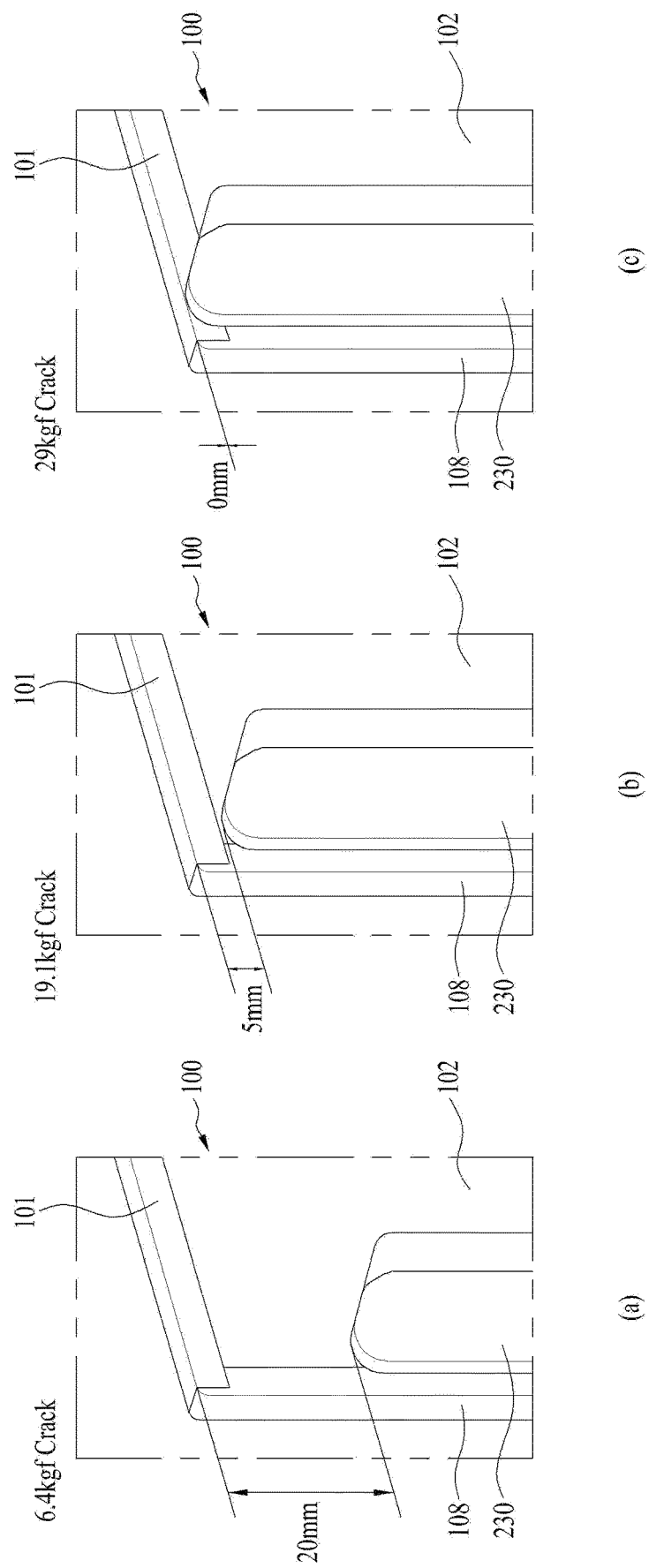
FIG. 16 is a view illustrating a crack load depending on a position of a link bracket of a display module.

FIG. 16 is a view illustrating a crack load depending on a position of the link bracket 230 of the display module 150. As described above, the link bracket 230 fastens the link 210 and the main body 100' to each other, and the link 210 slides on the link bracket 230 depending on the bending state of the main body 100'.

The link bracket 230 may extend vertically in order to transmit the force of the link 210 in the vertical direction. Therefore, the link bracket 230 may have a shape of a bar that is short in the horizontal direction and long in the vertical direction as shown in FIG. 3.

As the link bracket 230 extends in the direction of the end of the main body 100', rigidity of a corner thereof increases, so that a crack load thereof may increase. When the link bracket 230 is extended to a position 20 cm spaced apart from an upper end as shown in FIG. 16(a), the crack load at the corner is 6.4 kgf. The display device 100 in (a) is damaged under a load lower than 25 kgf and does not meet the reliability standards.

As in (b), when the link bracket 230 is extended to a position about 5 mm spaced apart from the upper end (or a lower end), the crack load is 19.1 kgf, which is increased compared to the embodiment of (a), but is still lower than 25 kgf.

As shown in (c), the link bracket 230 extends to an end of the upper end, overlaps with the horizontal middle frame above, and completely covers the corner, so that the rigidity of the corner may be improved. In the embodiment in which the vertical middle cabinet 108 containing the aluminum material with a thickness corresponding to D2 is applied and the length of the link bracket 230 is extended as shown in FIG. 16(c), the crack load may be obtained as 29 kgf.

The above-described crack load may vary depending on experimental conditions, and the thicknesses of the display module 150, the inner sheet 104, and the cover bottom 102.

In order to increase the crack load of the corner of the display device 100, one or more of methods such as changing the material and the structure of the vertical middle cabinet 108 and changing the length of the link bracket 230 may be applied in combination.

As described above, the display device 100 of the present disclosure may improve the durability of the display device 100 by increasing the crack load of the corner of the main body 100'.

In addition, despite the slip of the cover bottom 102 that occurs during the bending of the display device 100, the end of the cover bottom 102 may be covered so as not to be exposed to the outside, so that the exterior design may be improved and the defects such as the deformation may be prevented.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

What is claimed is:

1. A display device comprising:
   a main body including a display module for outputting an image and being bendable;
   a bending module located at a center of a back surface of the main body;
   a pair of links, wherein each link has one end coupled to the bending module and extends in a horizontal direction; and
   link brackets respectively located at left and right ends of the main body, wherein the other end of each link is connected to each link bracket,
   wherein the bending module changes angles of the pair of links,
   wherein, when the angle of the link changes, the other end of the link slides in the horizontal direction with respect to the link bracket,
   wherein the main body includes:
      an inner sheet disposed on a back surface of the display module;
      a cover bottom disposed on a back surface of the inner sheet; and
      a middle cabinet for covering perimeters of the display module, the inner sheet, and the cover bottom and forming a side surface appearance of the display device,
   wherein the link bracket is disposed overlapping the middle cabinet,
   wherein the middle cabinet includes each vertical middle cabinet located on each side of the main body,
   wherein the vertical middle cabinet includes:
      an exposed portion for forming the side surface appearance of the display device; and
      a rigid portion extending from an inner surface of the exposed portion, and
   wherein the display module is located in front of the rigid portion and the link bracket is coupled to a back surface of the rigid portion.

2. The display device of claim 1, further comprising a bracket fastener for connecting the link bracket and the main body to each other,
   wherein the bracket fastener is fastened to the rigid portion.

3. The display device of claim 1, wherein the middle cabinet further includes a rib located between the inner sheet and the cover bottom, and
   wherein the cover bottom slides on the rib when the main body is bent.

4. The display device of claim 3, wherein the link bracket covers an interface between the cover bottom and the vertical middle cabinet.

5. The display device of claim 1, wherein the middle cabinet includes each horizontal middle cabinet positioned at each of top and bottom of the main body and extending in the horizontal direction,
   wherein the horizontal middle cabinet further includes:
      an exposed portion for forming a side surface appearance of the main body; and
      a back protrusion located on the back surface of the main body, and
   wherein the link bracket extends to the top or the bottom of the main body to overlap the back protrusion.

6. The display device of claim 5, wherein the horizontal middle cabinet further includes:
   a first hook formed on the rib, and
   wherein the display device includes a second hook located at an end of the inner sheet and fastened to the first hook.

7. The display device of claim 1, wherein the middle cabinet contains aluminum.

8. The display device of claim 1, wherein, when the main body is bent, the other end of the link slides from a first portion of the link bracket to a second portion of the link bracket, and
   wherein the display device further includes a bracket fastener for connecting the second portion of the link bracket to the main body.

9. The display device of claim 8, wherein the link bracket includes a link side block in contact with the other end of the link, and
   wherein the link side block includes:
      a side wall for limiting a vertical position of the other end of the link; and
      a stopper for limiting a horizontal movement range of the other end of the link.

10. A display device comprising:
    a main body including a display module for outputting an image and being bendable;
    a bending module located at a center of a back surface of the main body;
    a pair of links, wherein each link has one end coupled to the bending module and extends in a horizontal direction; and
    link brackets respectively located at left and right ends of the main body, wherein the other end of each link is connected to each link bracket,
    wherein the bending module changes angles of the pair of links,
    wherein, when the angle of the link changes, the other end of the link slides in the horizontal direction with respect to the link bracket,
    wherein the main body includes:
       an inner sheet disposed on a back surface of the display module;
       a cover bottom disposed on a back surface of the inner sheet; and
       a middle cabinet for covering perimeters of the display module, the inner sheet, and the cover bottom and forming a side surface appearance of the display device,
    wherein the link bracket is disposed overlapping the middle cabinet,
    wherein the middle cabinet includes each horizontal middle cabinet positioned at each of top and bottom of the main body and extending in the horizontal direction,
    wherein the horizontal middle cabinet further includes:
       an exposed portion for forming a side surface appearance of the main body; and
       a back protrusion located on the back surface of the main body, and
    wherein the link bracket extends to the top or the bottom of the main body to overlap the back protrusion.

11. The display device of claim 10, wherein the horizontal middle cabinet further includes:
    a first hook formed on the rib, and
    wherein the display device includes a second hook located at an end of the inner sheet and fastened to the first hook.

12. A display device comprising:
a main body including a display module for outputting an image and being bendable;
a bending module located at a center of a back surface of the main body;
a pair of links, wherein each link has one end coupled to the bending module and extends in a horizontal direction; and
link brackets respectively located at left and right ends of the main body, wherein the other end of each link is connected to each link bracket,
wherein the bending module changes angles of the pair of links,
wherein, when the angle of the link changes, the other end of the link slides in the horizontal direction with respect to the link bracket,
wherein the main body includes:
an inner sheet disposed on a back surface of the display module;
a cover bottom disposed on a back surface of the inner sheet; and
a middle cabinet for covering perimeters of the display module, the inner sheet, and the cover bottom and forming a side surface appearance of the display device,
wherein the link bracket is disposed overlapping the middle cabinet, wherein, when the main body is bent, the other end of the link slides from a first portion of the link bracket to a second portion of the link bracket,
wherein the first portion is located outside the second portion in the horizontal direction and toward the left or right ends of the main body, and
wherein the display device further includes a bracket fastener for connecting the second portion of the link bracket to the main body.

13. The display device of claim 12, wherein the link bracket includes a link side block in contact with the other end of the link, and
wherein the link side block includes:
a side wall for limiting a vertical position of the other end of the link; and
a stopper for limiting a horizontal movement range of the other end of the link.

* * * * *